United States Patent
Tour et al.

(10) Patent No.: US 8,395,901 B2
(45) Date of Patent: Mar. 12, 2013

(54) VERTICALLY-STACKED ELECTRONIC DEVICES HAVING CONDUCTIVE CARBON FILMS

(75) Inventors: James M. Tour, Bellaire, TX (US); Yubao Li, Milpitas, CA (US); Alexander Sinitskiy, Ryazan (RU); Lin Zhong, Houston, TX (US); Mian Dong, Houston, TX (US); Jun Yao, Houston, TX (US)

(73) Assignee: William Marsh Rice University, Houston, TX (US)

( * ) Notice: Subject to any disclaimer, the term of this patent is extended or adjusted under 35 U.S.C. 154(b) by 563 days.

(21) Appl. No.: 12/270,246

(22) Filed: Nov. 13, 2008

(65) Prior Publication Data
US 2010/0284156 A1    Nov. 11, 2010

Related U.S. Application Data

(60) Provisional application No. 60/987,682, filed on Nov. 13, 2007, provisional application No. 60/988,857, filed on Nov. 19, 2007.

(51) Int. Cl.
*H05K 7/00* (2006.01)
*H01L 47/00* (2006.01)

(52) U.S. Cl. .................. 361/735; 361/679.01; 361/729; 257/1; 257/2; 257/5

(58) Field of Classification Search .................. 174/260; 257/401, 414, 324, 1–2, 4–5, 24; 361/305, 361/679.01, 729, 735; 365/103, 105
See application file for complete search history.

(56) References Cited

U.S. PATENT DOCUMENTS

| | | | | |
|---|---|---|---|---|
| 4,845,533 A * | 7/1989 | Pryor et al. | ......................... | 257/4 |
| 5,153,753 A * | 10/1992 | Ohta et al. | ....................... | 349/51 |
| 5,169,508 A * | 12/1992 | Suzuki et al. | ............. | 204/290.03 |
| 5,412,598 A * | 5/1995 | Shulman | ........................ | 365/174 |
| 6,515,888 B2 * | 2/2003 | Johnson et al. | ................ | 365/130 |
| 6,898,098 B2 * | 5/2005 | Snider et al. | ................ | 365/49.18 |
| 2003/0062594 A1 * | 4/2003 | Chen | ............................. | 257/530 |
| 2003/0206436 A1 * | 11/2003 | Eaton et al. | .................... | 365/177 |
| 2004/0002184 A1 * | 1/2004 | Cleeves | ......................... | 438/201 |
| 2004/0023514 A1 * | 2/2004 | Moriya et al. | ................ | 438/778 |
| 2004/0188721 A1 * | 9/2004 | Lieber et al. | .................. | 257/211 |

(Continued)

FOREIGN PATENT DOCUMENTS

| | | |
|---|---|---|
| EP | 1096569 | 5/2001 |
| EP | 1892722 | 2/2008 |

(Continued)

OTHER PUBLICATIONS

Johnson et al., 512-Mb PROM with a Three-Dimensional Array of Diode/Antifuse Memory Cells; IEEE Journal of Solid-State Circuits, vol. 38, No. 11, Nov. 2003.*

(Continued)

*Primary Examiner* — Timothy Thompson
*Assistant Examiner* — Sherman Ng
(74) *Attorney, Agent, or Firm* — Winstead PC

(57) ABSTRACT

Vertically-stacked electronic devices having conductive carbon films are disclosed. The vertically-stacked devices exhibit non-linear current-versus-voltage response over a voltage sweep range in various embodiments. The vertically-stacked devices may be assembled into arrays where the vertically-stacked devices may be electrically addressed independently of one another. Uses of the vertically-stacked electronic devices and arrays as two-terminal memory devices, logic units, and sensors are disclosed. Crossbar arrays of vertically-stacked electronic devices having conductive carbon films and nanowire electrodes are disclosed.

63 Claims, 15 Drawing Sheets

U.S. PATENT DOCUMENTS

| | | | |
|---|---|---|---|
| 2005/0083635 A1* | 4/2005 | Ooma et al. | 361/305 |
| 2005/0179029 A1* | 8/2005 | Furukawa et al. | 257/20 |
| 2005/0233263 A1* | 10/2005 | Park et al. | 430/324 |
| 2005/0242389 A1* | 11/2005 | Misra et al. | 257/314 |
| 2006/0066199 A1* | 3/2006 | Ichikawa et al. | 313/311 |
| 2006/0099750 A1* | 5/2006 | DeHeer et al. | 438/194 |
| 2006/0125025 A1* | 6/2006 | Kawashima et al. | 257/401 |
| 2006/0158760 A1* | 7/2006 | Portico Ambrosio et al. | 359/883 |
| 2006/0169585 A1* | 8/2006 | Nagahara et al. | 204/403.1 |
| 2006/0175601 A1* | 8/2006 | Lieber et al. | 257/19 |
| 2006/0233692 A1* | 10/2006 | Scaringe et al. | 423/335 |
| 2006/0240681 A1* | 10/2006 | Williams et al. | 438/800 |
| 2007/0063187 A1* | 3/2007 | Kawakami et al. | 257/40 |
| 2007/0101308 A1* | 5/2007 | Snider | 716/16 |
| 2007/0120252 A1* | 5/2007 | Tsakalakos | 257/734 |
| 2007/0187744 A1* | 8/2007 | Kreupl | 257/314 |
| 2007/0264623 A1* | 11/2007 | Wang et al. | 435/4 |
| 2008/0079029 A1* | 4/2008 | Williams | 257/213 |
| 2008/0094051 A1* | 4/2008 | Williams et al. | 324/76.11 |
| 2008/0099827 A1* | 5/2008 | Kreupl | 257/324 |
| 2008/0237886 A1* | 10/2008 | Wu et al. | 257/776 |

FOREIGN PATENT DOCUMENTS

| | | |
|---|---|---|
| WO | 98/45847 | 10/1998 |
| WO | 2009/043023 | 4/2009 |

OTHER PUBLICATIONS

Lemme, et al., "A graphene field-effect device", IEEE Electron Device Letters, 28:2007, pp. 282-284.

Morisaki, et al., "Memory-switching in amorphous carbon films", J. Non-Crys. Solids, 15:1974, pp. 531-534.

Han, et al., "Energy band-gap engineering of graphene nanoribbons", Phys. Rev. Lett., 98:2007, pp. 2068051-2068054.

Clough, et al., "Tetrahedrally bonded amorphous carbon (ta-C) thin film transistors", Electronics Lett., 32:1996, 498-499.

Echtermeyer, et al., "Nonvolatile switching in graphene field-effect devices", IEEE Electron Device Lett., 29:2008, pp. 952-954.

Standley, et al., "Graphene-based atomic-scale switches", Nano. Lett., 8:2008, pp. 3345-3349.

Johnson, et al., "512-Mb PROM with a three-dimensional array of diode/antifuse memory cells", IEEE J. Solid-State Circuits, 38:2003, pp. 1920-1928.

Li, et al., "Room-temperature negative differential conductance in carbon nanotubes", Carbon 43:2005, pp. 667-670.

Li, et al., "Negative differential resistance in tunneling transport through C60 encapsulated double-walled carbon nanotubes", Appl. Phys. Lett. 90:2007, pp. 0731061-0731063.

Larade, et al., "Conductance, I-V curves, and negative differential resistance of carbon atomic wires", Phys. Rev. B 64:2001, pp. 0754201-07542010.

Farajian, et al., "Nonlinear coherent transport through doped nanotube junctions", Phys. Rev. Lett. 82:1999, pp. 5084-5087.

Léonard, et al., "Negative differential resistance in nanotube devices", Phys. Rev. Lett. 85:2000, pp. 4767-4770.

Rueckes, et al., "Carbon nanotube-based nonvolatile random access memory for molecular computing", Science 289:2000, pp. 94-97.

Franklin, et al., "Integration of suspended carbon nanotube arrays into electronic devices and electromechanical systems", Appl. Phys. Lett. 81:2002, pp. 913-915.

Cha, et al., "Fabrication of a nanoelectromechanical switch using a suspended carbon nanotube", Appl. Phys. Lett. 86:2005, pp. 0831051-0831053.

Dujardin, et al., "Self-assembled switches based on electroactuated multiwalled nanotubes", Appl. Phys. Lett. 87:2005, pp. 1931071-1931073.

Deshpande, et al., "Carbon nanotube linear bearing nanoswitches", Nano Lett. 6:2006, pp. 1092-1095.

Jang, et al., "Nanoscale memory cell based on a nanoelectromechanical switched capacitor",. Nature Nanotech. 3:2008, pp. 26-30.

Wang, et al., "Room-temperature all-semiconducting sub-10-nm graphene nanoribbon field-effect transistors", Phys. Rev. Lett. 100:2008, pp. 2068031-20680314.

Collins, et al., "Current saturation and electrical breakdown in multiwalled carbon nanotubes", Phys. Rev. Lett. 86:2001, pp. 3128-3131.

Li, et al., "SiC-SiO2-C coaxial nanocables and chains of carbon nanotube-SiC heterojunctions", Adv. Mater. 16:2004, pp. 93-96.

International Search Report and Written Opinion for PCT/US2008/083337 mailed Mar. 23, 2009.

PCT Invitation to Pay Addition Fees for PCT/US2008/078152, mailed Feb. 17, 2009.

* cited by examiner

VERTICALLY-STACKED ELECTRONIC DEVICES HAVING CONDUCTIVE CARBON FILMS

CROSS-REFERENCE TO RELATED APPLICATIONS

This application claims priority to U.S. provisional patent applications 60/987,682 filed Nov. 13, 2007 and 60/988,857 filed Nov. 19, 2007, which are each incorporated by reference as if written herein in their entirety.

STATEMENT REGARDING FEDERALLY SPONSORED RESEARCH

This invention was made with government support under Grant Number NCC1-02038, awarded by the National Aeronautics and Space Administration; and Grant Number W911NF-08-C-0019, awarded by the U.S. Department of Defense. The government has certain rights in the invention.

BACKGROUND

Transistors are a bulwark of electronic switching and memory applications due to their extreme reliability and high ON/OFF ratios of $10^4$-$10^5$. Transistors are three-terminal devices that include source, drain, and gate electrode terminals. Corresponding two-terminal electronic devices, having only a source and a drain, typically have ON/OFF ratios that are orders of magnitude smaller than transistors. Two-terminal electronic devices can be operable in switching and memory applications, if the devices display a non-linear current-versus-voltage response and have a great enough and reliable ON/OFF ratio.

Molecular-based devices and one-dimensional carbon nanostructures having non-linear current-versus-voltage response and current peak-to-valley ratios (PVRs) generally on the order of 2 to 100 have been reported. Likewise, two-terminal memory devices have been described that are based upon metal filamentary mechanisms. These include molecular-spaced devices, nanowire crossbar memories, and resistive random access memories using transition metal oxides. Two-terminal electronic devices, which contain conductive carbon sheets deposited between two electrode terminals and which display a non-linear current-versus-voltage response, have been described in co-pending and commonly owned U.S. patent application Ser. No. 12/240,673 and PCT application PCT/US08/78152. The two-terminal electronic devices reported therein display high ON/OFF ratios and can be written and read multiple times in memory applications.

Feasible fabrication of two-terminal electronic devices into arrays having a high device density is favorable for many electronics applications. High-density array fabrication techniques may encompass a three-dimensional orientation of the electronic devices in the array. A three-dimensional, two-terminal memory device array has been reported based on a conventional P-N junction. The nature of the P-N junction disclosed provides a device array capable of only being written a single time, however.

In view of the foregoing, development of two-terminal electronic devices exhibiting nonlinear current-versus-voltage response, having high and reliable ON/OFF ratios characterized by large current PVRs, and having the capability to be fabricated in high-density device arrays is of substantial benefit. Such electronic devices and arrays may have applications in electronic switching, memory, and sensor applications. Particularly in memory applications, devices and arrays having stable, re-writable, non-volatile, and non-destructive read memories with fast switching times are of substantial benefit in countless electronics applications where computer memory is used.

SUMMARY

In various embodiments, vertically-stacked electronic devices are described. The vertically-stacked electronic devices include two electrode terminals and a carbon film having at least two graphitic layers. At least a portion of the carbon film lies between the two electrode terminals. The carbon film is in electrical contact with the two electrode terminals. The vertically-stacked electronic devices exhibit nonlinear current-versus-voltage response when operated over a voltage sweep range. In some embodiments, the electronic devices may, for example, be used as two-terminal memory devices, logic switches, and sensors.

In other various embodiments, vertically-stacked electronic devices are described. The vertically-stacked electronic devices include a first electrode terminal, a carbon film having at least two graphitic layers, and at least one dielectric material. The carbon film forms a second electrode terminal. The at least one dielectric material lies between at least a portion of the first electrode terminal and at least a portion of the carbon film. The vertically-stacked electronic devices exhibit nonlinear current-versus-voltage response when operated over a voltage sweep range. In some embodiments, the electronic devices may, for example, be used as two-terminal memory devices, logic switches, and sensors.

In various embodiments, arrays having a plurality of vertically-stacked electronic devices are described. Each of the plurality of the vertically-stacked electronic devices includes two electrode terminals and a carbon film having at least two graphitic layers. At least a portion of the carbon film lies between the two electrode terminals. The carbon film is in electrical contact with the two electrode terminals. Each of the plurality of the vertically-stacked electronic devices exhibits nonlinear current-versus-voltage response when operated over a voltage sweep range. Each of the plurality of the vertically-stacked electronic devices is electrically addressed independently. In some embodiments, the arrays may, for example, be used as two-terminal multi-bit memory devices, logic switches, and sensors.

In other various embodiments, arrays having a plurality of vertically-stacked electronic devices are described. Each of the plurality of the vertically-stacked electronic devices includes a first electrode terminal, a carbon film having at least two graphitic layers, and at least one dielectric material. The carbon film forms a second electrode terminal. The at least one dielectric material lies between at least a portion of the first electrode terminal and at least a portion of the carbon film. Each of the plurality of the vertically-stacked electronic devices exhibits nonlinear current-versus-voltage response when operated over a voltage sweep range. Each of the plurality of the vertically-stacked electronic devices is electrically addressed independently. In some embodiments, the arrays may, for example, be used as two-terminal multi-bit memory devices, logic switches, and sensors.

In still other various embodiments, crossbar arrays of vertically-stacked electronic devices are described. The crossbar arrays include at least one layer having a carbon film and at least two nanowire layers. The carbon film includes at least two graphitic layers. The nanowire layers include a plurality of parallel nanowires. A first plurality of parallel nanowires in a first nanowire layer is orthogonal to a second plurality of parallel nanowires in alternating nanowire layers. The plurality of parallel nanowires is in electrical contact with the at least one layer having a carbon film. The at least one layer having a carbon film and the at least two nanowire layers form a plurality of vertically-stacked electronic devices. Each of the plurality of the vertically-stacked electronic devices exhibits nonlinear current-versus-voltage response when operated over a voltage sweep range. In some embodiments, the crossbar arrays may, for example, be used as two-terminal multi-bit memory devices, logic switches, and sensors.

The foregoing has outlined rather broadly various features of the present disclosure in order that the detailed description that follows may be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing a specific embodiment of the disclosure, wherein.

DETAILED DESCRIPTION

Figure 1:
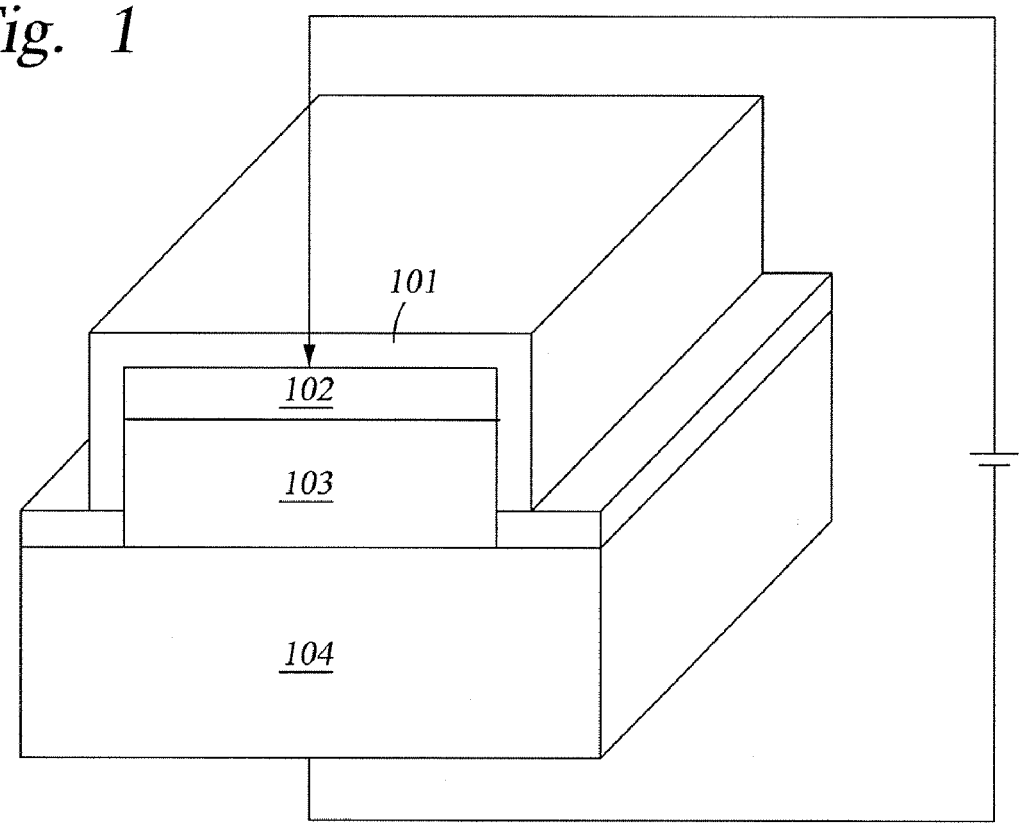
FIG. 1 presents a schematic illustration of a four-layer C—Cr—$SiO_2$-$p^{++}$-Si vertically-stacked electronic device.

In the following description, certain details are set forth such as specific quantities, sizes, etc. so as to provide a thorough understanding of the various embodiments disclosed herein. However, it will be obvious to those skilled in the art that the present disclosure may be practiced without such specific details. In many cases, details concerning such considerations and the like have been omitted inasmuch as such details are not necessary to obtain a complete understanding of the present disclosure and are within the skills of persons of ordinary skill in the relevant art.

Referring to the drawings in general, it will be understood that the illustrations are for the purpose of describing a particular embodiment of the disclosure and are not intended to be limiting thereto. Drawings are not necessarily to scale.

While most of the terms used herein will be recognizable to those of skill in the art, the following definitions are nevertheless put forth to aid in the understanding of the present disclosure. It should be understood, however, that when not explicitly defined, terms should be interpreted as adopting a meaning presently accepted by those of skill in the art.

"Array," as defined herein, refers to, for example, an arrangement of multiple vertically-stacked electronic devices.

"Bias," as defined herein, refers to, for example, a predetermined voltage applied to a vertically-stacked electronic device that causes the vertically-stacked electronic device to operate in a certain desired fashion or to set a certain operating point.

"Discontinuous carbon film," as defined herein, refers to, for example, discontinuous graphitic layers. A carbon film is discontinuous if a coverage area of the carbon film is not completely spanned by a single graphitic layer. In other words, a discontinuous carbon film is formed by at least two overlapping graphitic layers. In typical embodiments, a coverage area of the discontinuous carbon film lies between two electrode terminals. In other typical embodiments, the discontinuous carbon film is in electrical contact with a first electrode terminal, and the discontinuous carbon film itself forms a second electrode terminal. The discontinuous carbon film can be formed from distorted graphene sheets or buckled graphene sheets in some embodiments. Distortion can result from insertion of sp³-hybridized carbon atoms into predominantly sp²-hybridized graphene sheets. Buckling can result from bends in the lattice planes of the graphene sheets.

"Graphene," as defined herein, refers to, for example, a single graphite sheet that is typically less than about 10 carbon layers thick.

"Graphitic," as defined herein, refers to, for example, both graphene and graphite layers. Further, the term "graphitic" refers to, for example, a discontinuous carbon film comprising graphite, graphene, and combinations thereof.

"Negative differential resistance (NDR)," as defined herein, refers to, for example, a current decrease in response to an increase in bias voltage. A mechanistic origin of the effect is sometimes implied in certain descriptions of materials having NDRs. As used herein, the term "bistable current-voltage (BIV) behavior," is typically used to describe an NDR-like effect, where no mechanistic implications are made.

"Peak-to-valley ratio (PVR)," as defined herein, refers to, for example, the ratio of maximum current response obtained within a given voltage sweep to minimum current response obtained within the voltage sweep.

"Threshold voltage ($V_{th}$)," as defined herein, refers to, for example, the voltage at which a maximum or minimum current peak occurs in a device exhibiting BIV behavior.

Figure 2:
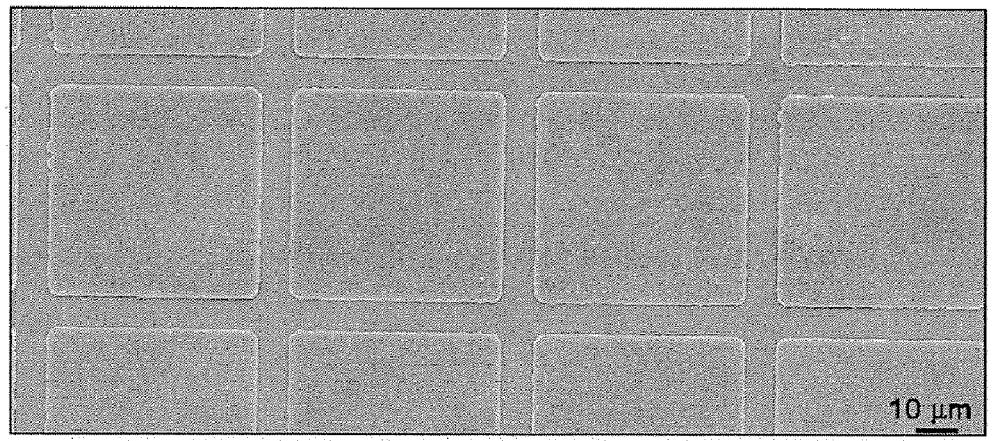
FIG. 2 illustrates an SEM image (top view) of a C—Cr—$SiO_2$-$p^{++}$-Si vertically-stacked electronic device array.

In various embodiments presented hereinbelow, vertically-stacked electronic devices are referenced. The vertically-stacked electronic devices may be represented in a generic form $Z_1$-$Z_2$-$Z_3$-$Z_4$, wherein $Z_1$, $Z_2$, $Z_3$ and $Z_4$ represent various layers of the vertically-stacked electronic devices. Any number of layers greater than two may be present in the vertically-stacked electronic devices, and the form $Z_1$-$Z_2$-$Z_3$-$Z_4$ should not be considered limiting. FIG. 1 presents a schematic illustration of a non-limiting four-layer vertically-stacked electronic device 100. The illustrative four-layer vertically-stacked electronic device presented in FIG. 1 is a C—Cr—$SiO_2$-$p^{++}$-Si vertically-stacked electronic device. The C—Cr—$SiO_2$-$p^{++}$-Si vertically-stacked electronic device shown in FIG. 1 includes a carbon film layer (C) 101 deposited on a chromium layer (Cr) 102. The chromium layer 102 is deposited on a $SiO_2$ layer 103. The $SiO_2$ layer 103 is deposited on a p-type silicon layer ($p^{++}$-Si) 104. The four-layer vertically-stacked electronic device 100 further includes electrical contact points 105, which are made to the carbon film layer 101 and p-type silicon layer 104. FIG. 2 illustrates a top view SEM image of a C—Cr—$SiO_2$-$p^{++}$-Si vertically-stacked electronic device array.

In the C—Cr—$SiO_2$-$p^{++}$-Si vertically-stacked electronic device illustrated in FIG. 1, the p-type silicon layer 104 forms a first electrode terminal and the carbon film layer 101 forms a second electrode terminal. In some embodiments of the vertically-stacked electronic devices, at least a portion of the carbon film layer 101 lies between two electrode terminals. When the carbon film layer 101 lies between two electrode terminals, conduction electrons travel from the first electrode terminal (source electrode) through the carbon film layer 101 to the second electrode terminal (drain electrode). Any portion of the carbon film layer 101 not residing between the two electrode terminals may overcoat at least one side of the vertically-stacked electronic device 100 and bridge between one or more vertically-stacked electronic device layers.

Certain electrical properties of the vertically-stacked electronic devices disclosed hereinbelow confer advantageous benefits to the vertically-stacked electronic devices, particularly for their use in switching, sensing, and memory applications. The vertically-stacked electronic devices exhibit BIV behavior and display high PVRs in their current-versus-voltage response. Further, transition from a low conduction state to a high conduction state in the vertically-stacked electronic devices is characterized by a sharp threshold voltage ($V_{th}$) occurring over a very narrow voltage transition. Although the switching and memory performance of the vertically-stacked electronic devices is somewhat variable from device to device based on various construction parameters, such operational variability lies within the spirit and scope of the disclosure. The vertically-stacked electronic devices offer considerably advanced properties over existing two-terminal electronic devices, including the ability to be feasibly oriented into arrays of multiple vertically-stacked electronic devices. Such arrays of multiple vertically-stacked electronic devices are particularly useful for switching, sensing, and memory applications.

Parameters that influence overall performance of the vertically-stacked electronic devices may include, for example, separation and composition of the electrode terminals, presence and thickness of a dielectric material, carbon film thickness, and overall device size. In certain experimental embodiments of the vertically-stacked electronic devices presented herein, switching voltages are relatively high due to the fairly large sizes of the assembled vertically-stacked electronic devices. Switching voltages may, for example, be lowered by reducing the size of the vertically-stacked electronic devices. Sizes of the vertically-stacked electronic devices is limited only by the state of the art in fabrication techniques. The sizes of the vertically-stacked electronic devices presented herein should not be considered limiting, particularly with regard to their performance.

In typical embodiments of the vertically-stacked electronic devices, the nonlinear current-versus-voltage response includes at least about a 10-fold change in current over a voltage sweep range of approximately 0.5 V. In other embodiments of the vertically-stacked electronic devices, the nonlinear current-versus-voltage response includes a change in current between about 10-fold and $10^9$-fold over a voltage sweep range of approximately 0.5 V. In still other embodiments of the vertically-stacked electronic devices, the nonlinear current-versus-voltage response includes a change in current between about $10^5$-fold and $10^9$-fold over a voltage sweep range of approximately 0.5 V. These operational characteristics beneficially provide high PVRs and reliable ON/OFF ratios in operation of the devices.

A number of different methods may be used to deposit a carbon film on any of the vertically-stacked electronic devices disclosed herein. In typical embodiments of the vertically-stacked electronic devices, the carbon film may comprise, for example, as few as two graphitic layers and up to $10^6$ graphitic layers and greater. The suitability of a particular deposition technique is dependent upon the carbon film thickness and type. Chemical vapor deposition (CVD) represents an illustrative deposition technique that is particularly useful for depositing a carbon film on the vertically-stacked electronic devices. Carbon atom sputtering, ink-jet printing and solution spin-coating may also be utilized, for example, to deposit a carbon film in certain embodiments. A discontinuous carbon film is beneficial in certain embodiments of the vertically-stacked electronic devices. In typical embodiments of the vertically-stacked electronic devices, CVD and carbon atom sputtering produce a discontinuous carbon film on the vertically-stacked electronic devices. Although CVD and carbon atom sputtering may both be used to deposit a discontinuous carbon film, carbon atom sputtering is considerably less expensive to conduct than is CVD, especially in a commercial setting.

In the CVD method, the carbon film is deposited from a gas comprising at least one carbon-containing compound. The gas may further comprise hydrogen, which acts as a diluent and reductant. The carbon-containing compound may be selected, for example, from a non-limiting group including acetylene, ethylene, methane, ethane, carbon monoxide, and combinations thereof. In typical embodiments, the carbon film is deposited at a temperature between about 400° C. and about 900° C. In some embodiments, the carbon film is typically deposited at a temperature between about 800° C. and about 900° C. The length of the deposition time determines a thickness of the carbon film obtained. In typical embodiments, the deposition time length varies between about one minute and about thirty minutes. An annealing step may follow deposition of the carbon film.

In various embodiments, vertically-stacked electronic devices are described. The vertically-stacked electronic devices comprise two electrode terminals and a carbon film comprising at least two graphitic layers. At least a portion of the carbon film lies between the two electrode terminals. The carbon film is in electrical contact with the two electrode terminals. The vertically-stacked electronic devices exhibit nonlinear current-versus-voltage response when operated over a voltage sweep range. In various embodiments of the vertically-stacked electronic devices, the at least two graphitic layers comprise a discontinuous carbon film. In various embodiments of the vertically-stacked electronic devices, the discontinuous carbon film comprises a material selected from a group consisting of graphene, graphite and combinations thereof. Graphene and graphite refer to the graphitic layers in the vertically-stacked electronic devices.

Since the carbon films of the vertically-stacked electronic devices are only a few graphitic layers thick, the carbon films are approximately two-dimensional. Carbon film residing between the two electrode terminals forms a plane perpendicular to a vertical axis of the vertically-stacked electronic devices. Carbon film not residing between the two electrode terminals forms a plane approximately parallel to a vertical axis of the vertically-stacked electronic devices. In certain embodiments, current flows between the two electrode terminals in a perpendicular fashion through the carbon film plane perpendicular to a vertical axis of the vertically-stacked electronic devices. In other embodiments, current flows along a plane of the carbon film parallel to a vertical axis of the vertically-stacked electronic devices. As discussed hereinabove, a discontinuous carbon film may be fabricated in the vertically-stacked electronic devices by non-limiting CVD and carbon atom sputtering methods. In various embodiments of the vertically-stacked electronic devices, the carbon film is deposited by a technique selected from a group consisting of chemical vapor deposition and carbon atom sputtering. The ability to form a discontinuous carbon film by CVD and carbon atom sputtering methods provides advantageous simplification for fabricating certain embodiments of the vertically-stacked electronic devices.

In various embodiments of the vertically-stacked electronic devices, the vertically-stacked electronic devices further comprise at least one dielectric material. In some embodiments, the dielectric material lies between at least one electrode terminal and the carbon film. In some embodiments, the dielectric material contacts at least one electrode terminal. In some embodiments, the dielectric material contacts the carbon film. In some embodiments, the dielectric material contacts at least one electrode terminal and the carbon film. In some embodiments of the vertically-stacked electronic devices, the at least one dielectric material lies between at least a portion of the carbon film and at least a portion of at least one of the two electrode terminals. In embodiments where the dielectric material lies between the carbon film and at least one electrode terminal, the carbon film may overcoat at least one side of the vertically-stacked electronic device and bridge between one or more device layers. When overcoating occurs, conduction may occur along a plane of the carbon film parallel to a vertical axis of the vertically-stacked electronic devices, rather than through a plane of the carbon film perpendicular to a vertical axis of the vertically-stacked electronic devices. In various embodiments of the vertically-stacked electronic devices, the at least one dielectric material is selected, for example, from a group consisting of silicon dioxide, silicon nitride, aluminum oxide, titanium nitride, glass, plastic, and combinations thereof.

The two electrode terminals of the vertically-stacked electronics devices may be constructed from materials exhibiting conducting or semiconducting properties. In typical embodiments, semiconductor materials may be intrinsic semiconductors, or the semiconductors may be n-doped or p-doped. In various embodiments of the vertically-stacked electronic devices, illustrative materials comprising the two electrode terminals include, for example, at least one material selected from a group consisting of silicon, silicon carbide, gallium arsenide, platinum, palladium, aluminum, copper, tin, gold, silver, titanium, chromium, tungsten and combinations thereof. Selection of the at least one material is conducted independently for each of the two electrode terminals. One skilled in the art will recognize that physical properties of the various electrode materials will confer different properties to certain embodiments of the vertically-stacked electronic devices. All combinations of the vertically-stacked electronic device construction parameters and materials combinations reside fully within the spirit and scope of the present disclosure.

Figure 3A:
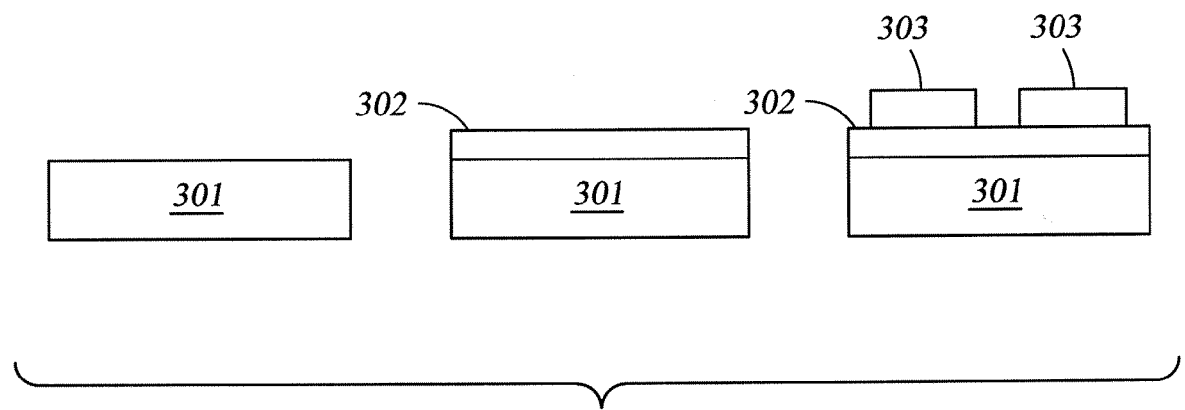
FIG. 3A presents a side-view schematic illustration of a vertically-stacked electronic device having two electrode terminals, wherein the vertically-stacked electronic device is constructed in a device array.
Figure 3B:
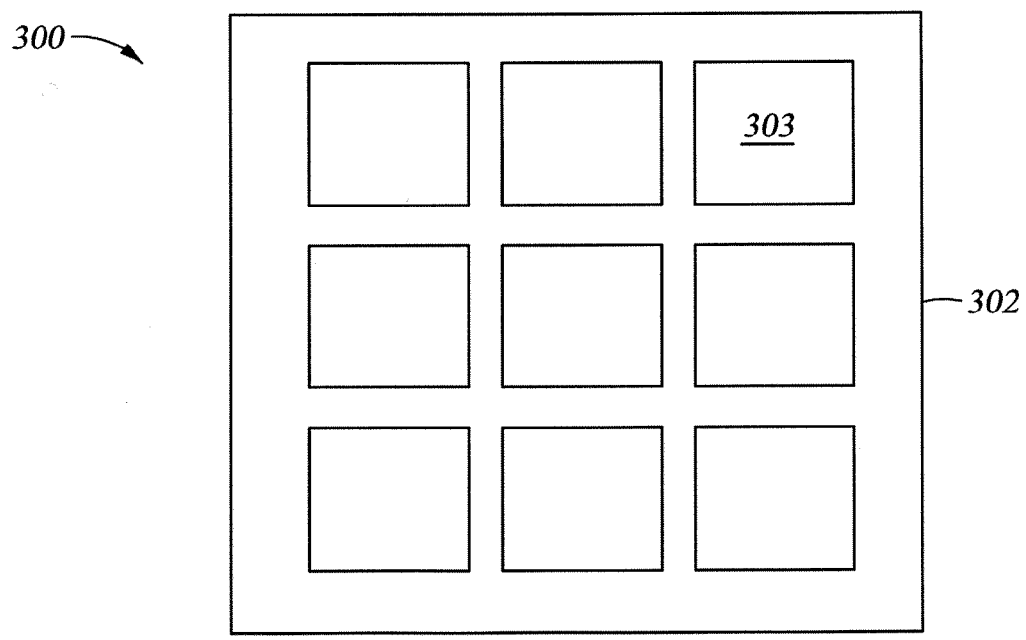
FIG. 3B presents a top-view schematic illustration of a vertically-stacked electronic device having two electrode terminals, wherein the vertically-stacked electronic device is constructed in a device array.

FIGS. 3A and 3B presents a schematic illustration of a vertically-stacked electronic device having two electrode terminals, wherein the vertically-stacked electronic device is constructed in a device array. Illustrative steps utilized to construct a vertically-stacked electronic device having two electrode terminals is depicted in FIG. 3A. In FIG. 3A, a first electrode layer 301 is first coated with a graphitic layer 302. A second electrode layer 303 is then patterned on to the graphitic layer 302. Construction of the vertically-stacked electronic devices in this manner produces a vertically-stacked electronic device array 300. A top view schematic illustration of the vertically-stacked electronic device array 300 is presented in FIG. 3B. Note that in the non-limiting embodiment presented in FIGS. 3A and 3B, the vertically-stacked electronic devices are not electrically isolated from one another. Arrays of the vertically-stacked electronic devices can be prepared in various configurations where the individual devices are electrically isolated from one another, and the configuration shown in FIGS. 3A and 3B should not be considered limiting.

In some embodiments of the vertically-stacked electronic devices, the vertically-stacked electronic devices comprise two-terminal memory devices having an ON/OFF memory state. In some embodiments, the vertically-stacked electronic devices have an ON/OFF ratio of at least about 100:1 for measuring recorded currents in the ON and OFF states. High ON/OFF ratios are characteristic of the vertically-stacked electronic devices as a result of their beneficial electronic properties noted hereinabove. The ON/OFF ratios characteristic of the vertically-stacked electronic devices are well suited for use of the vertically-stacked electronic devices in memory applications. Further, the vertically-stacked electronic devices demonstrate robustness over multiple readwrite-erase cycles. In some embodiments of the vertically-stacked electronic devices, the vertically-stacked electronic devices comprise logic switches.

In some embodiments of the vertically-stacked electronic devices, the vertically-stacked electronic devices comprise sensors. Operating the vertically-stacked electronic devices as sensors may, for example, allow the vertically-stacked electronic devices to detect a wide range of molecules based on alteration of observed electrical properties or BIV behavior. For example, a molecule may become adsorbed to the carbon film of the vertically-stacked electronic devices and alter electrical properties or BIV behavior of the vertically-stacked electronic devices. Such adsorption comprises an embodiment of non-covalent bonding. Alternatively, a molecule may become covalently bound to the carbon film of the vertically-stacked electronic devices and alter electrical properties or BIV behavior of the vertically-stacked electronic devices. One skilled in the art will recognize that the carbon film of the vertically-stacked electronic devices may be modified to alter affinity for a given molecule. The affinity change may be in the vertically-stacked electronic device's low conductance state, high conductance state, or both low and high conductance states.

Methods for modifying graphitic films are well known in the art, and various modification methods may be utilized to alter carbon film affinity toward a given molecule. Illustrative chemistries for modifying the carbon film of the vertically-stacked electronic devices may include, for example, the Billups reaction or Tour diazonium-based functionalization. The Billups reaction includes reaction of the carbon film with an alkali metal, such as Li or Na, in liquid ammonia, followed by a reaction with an electrophile, such as, for example, an alkyl halide, aryl halide, or carbonyl. The Tour diazonium-based functionalization includes a radical-based introduction of aryl groups to the carbon film. Related chemistries may be envisioned by those skilled in the art. Groups that may be covalently bound to the carbon film include, for example, alkyl groups, aryl groups (arenes), halides, carboxylic acids, amines, substituted amines, amides, carboxylic esters, sulfonic acids, sulfonamides, alkoxy groups, and aryloxy groups. The carbon film may be covalently bonded to a group capable of coordinating a metal ion, such as, for example, a chelating group. Sensors derived from vertically-stacked electronic devices having a carbon film functionalized with a chelating group may be particularly useful in applications for detecting metal ions.

Carbon films in the vertically-stacked electronic devices may also be covalently attached to biomolecules including, but not limited to, nucleic acids, DNA, RNA, oligonucleotides, polynucleotides, nucleosides, nucleotides, amino acids, peptides, oligopeptides, polypeptides, proteins, glycoproteins, enzymes, lipids, phospholipids, glycolipids, hormones, peptide hormones, neurotransmitters, carbohydrates, sugars, monosaccharides, disaccharides, trisaccharides, oligosaccharides, polysaccharides, antibodies, antibody fragments, and synthetic derivatives and analogs thereof. These non-limiting biomolecule functionalizations may be used to alter the carbon film affinity of the vertically-stacked electronic devices toward binding of a given molecule, biomolecule, or analyte. Attachments of biomolecules may be accomplished, for example, through Tour diazonium functionalization or through non-covalent adsorption reactions.

Operation of the vertically-stacked electronic devices may promote covalent functionalization of the carbon film through applying a voltage sweep. The carbon film may be previously functionalized with covalent bonds, or the carbon film may be previously unfunctionalized.

Operation of the vertically-stacked electronic devices may also promote non-covalent functionalization of the carbon film such as, for example, through adsorption of molecules. In other words, the carbon film is modified through non-covalent bonding. The adsorbed molecules may change the electronic properties or BIV behavior of the vertically-stacked electronic devices. Adsorbed molecules may include, for example, alkyl groups, aryl groups (arenes), halides, carboxylic acids, amines, substituted amines, amides, carboxylic esters, sulfonic acids, sulfonamides, alkoxy groups, aryloxy groups, and styrenes.

Operation of the vertically-stacked electronic devices or sensors derived therefrom within a voltage sweep range may promote displacement of at least one molecule from the carbon film. In typical embodiments, the at least one molecule displaced is previously covalently bound to the carbon film. In other embodiments, the at least one molecule displaced is previously non-covalently bound to the carbon film. In some embodiments, the at least one molecule displaced is adsorbed to the carbon film. In certain embodiments, the at least one molecule displaced comprises at least one analyte.

In various embodiments of the vertically-stacked electronic devices, the vertically-stacked electronic devices are constructed atop a substrate. An illustrative substrate comprises, for example, a dielectric material. In other embodiments, the vertically-stacked electronic devices are constructed below the surface of a substrate. For example, the vertically-stacked electronic devices may be assembled in a hole or depression formed in the substrate. The advantages and utility of assembling the vertically-stacked electronic devices in holes or depressions will be evident to one having skill in the art of assembling electronic devices. In typical embodiments, the vertically-stacked electronic devices are at least partially below the surface of the substrate. In some embodiments, the vertically-stacked electronic devices are entirely below the surface of the substrate.

Other embodiments of vertically-stacked electronic devices are also described. For example, instead of having two electrode terminals, certain embodiments of the vertically-stacked electronic devices display conduction along a plane of the carbon film parallel to a vertical axis of the vertically-stacked electronic devices. In such embodiments, the carbon film itself serves as an electrode terminal. The vertically-stacked electronic devices demonstrating conduction along a plane of the carbon film may optionally have an electrical contact point, which may be a metal or semiconductor, for example, patterned on to the carbon film.

Figure 4A:
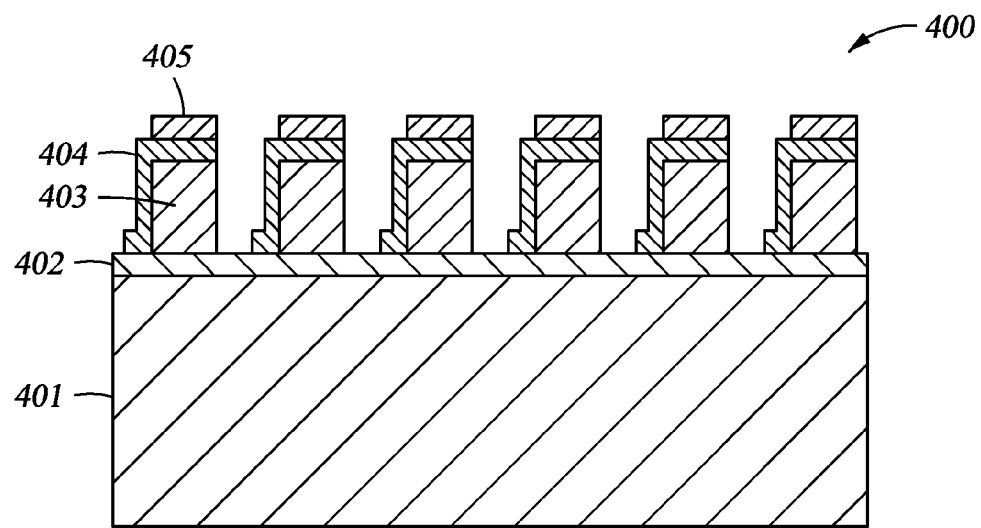
FIG. 4A presents a side-view schematic illustration of an array of vertically-stacked electronic devices exhibiting conduction along a plane of the carbon film parallel to a vertical axis of the vertically-stacked electronic devices.
Figure 4B:
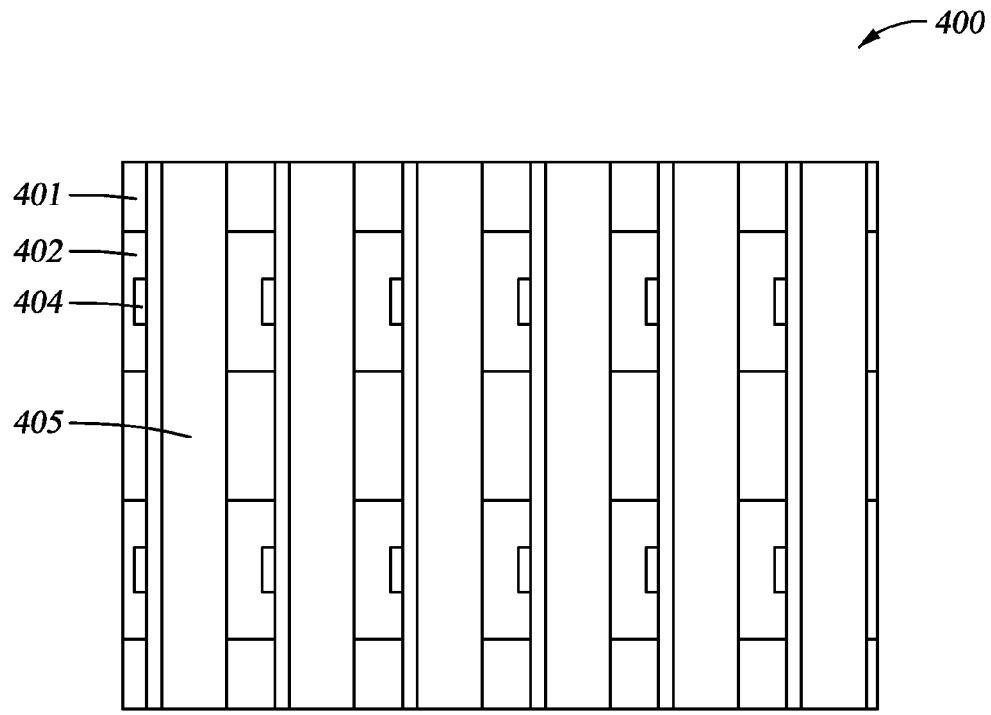
FIG. 4B presents a top-view schematic illustration of an array of vertically-stacked electronic devices exhibiting conduction along a plane of the carbon film parallel to a vertical axis of the vertically-stacked electronic devices.

FIGS. 4A and 4B present a schematic illustration of an array of vertically-stacked electronic devices exhibiting conduction along a plane of the carbon film parallel to a vertical axis of the vertically-stacked electronic devices. The schematic presented in FIGS. 4A and 4B is merely illustrative of vertically-stacked electronic devices exhibiting conduction along a plane of the carbon film and should not be considered limiting thereto. As shown in FIGS. 4A and 4B, an array of vertically-stacked electronic devices 400 is constructed on a silicon substrate 401, which is patterned with doped silicon lines 402. A layer of $SiO_2$ dielectric 403 is patterned over the doped silicon lines 402, and then graphitic layer 404 is deposited over the $SiO_2$ dielectric layer 403. A metal contact layer 405 is then deposited over the graphitic layer 404. As discussed hereinabove, the metal contact layer 405 is optional, and a closed electric circuit can be established directly with the graphitic layer 404.

In typical embodiments, current flows along a carbon film plane parallel to a vertical axis of the vertically-stacked electronic devices. In various embodiments, the vertically-stacked electronic devices comprise a first electrode terminal, a carbon film comprising at least two graphitic layers, and at least one dielectric material. The carbon film comprises a second electrode terminal. The at least one dielectric material lies between at least a portion of the first electrode terminal and at least a portion of the carbon film. The vertically-stacked electronic devices exhibit nonlinear current-versus-voltage response when operated over a voltage sweep range. In various embodiments of the vertically-stacked electronic devices, the at least two graphitic layers comprise a discontinuous carbon film. In various embodiments of the vertically-stacked electronic devices, the discontinuous carbon film comprises a material selected from a group consisting of graphene, graphite and combinations thereof. Graphene and graphite refer to a graphitic layer in the vertically-stacked electronic devices. In various embodiments of the vertically-stacked electronic devices, the carbon film is deposited by a technique selected from a group consisting of chemical vapor deposition and carbon atom sputtering. As discussed hereinabove, CVD and carbon atom sputtering are advantageous for producing discontinuous carbon films in the vertically-stacked electronic devices.

In various embodiments of the vertically-stacked electronic devices, the at least one dielectric material is selected from a group consisting of silicon dioxide, silicon nitride, aluminum oxide, titanium nitride, glass, plastic, and combinations thereof. In various embodiments of the vertically-stacked electronic devices, the first electrode terminal comprises at least one material selected from a group consisting of silicon, silicon carbide, gallium arsenide, platinum, palladium, aluminum, copper, tin, gold, silver, titanium, chromium, tungsten, and combinations thereof.

In various embodiments of the vertically-stacked electronic devices, the vertically-stacked electronic devices comprise two-terminal memory devices having an ON/OFF memory state. In other various embodiments, the vertically-stacked electronic devices comprise sensors. In still other various embodiments, the vertically-stacked electronic devices comprise logic switches. Illustrative variations and advantages of the vertically-stacked electronic devices have been discussed in more detail hereinabove when the devices used in memory, sensing and logic switching applications.

In various embodiments, the vertically-stacked electronic devices are constructed atop a substrate. An illustrative substrate comprises, for example, a dielectric material. In various other embodiments, the vertically-stacked electronic devices are constructed below the surface of a substrate. For example, the vertically-stacked electronic devices may be assembled in a hole or depression formed in a substrate. The advantages and utility of assembling the vertically-stacked electronic devices in holes will be evident to one having skill in the art of assembling electronic devices. In various embodiments, the vertically-stacked electronic devices are at least partially below the surface of the substrate. In some embodiments, the vertically-stacked electronic devices are entirely below the surface of the substrate.

Horizontal fabrication of two-terminal electronic devices have been described in co-pending and commonly owned U.S. patent application Ser. No. 12/240,673 and PCT application PCT/US08/78152, which are hereby incorporated by reference. Fabrication of two-terminal electronic devices in a vertical stack orientation provides advantageous benefits over a horizontal orientation in certain embodiments. This utility particularly is evident when constructing arrays of two-terminal electronic devices. For example, vertical stacking beneficially allows smaller arrays with a higher density of individual electronic devices to be fabricated than is possible utilizing a horizontal device configuration. Such vertical processing techniques are among those typically used in semiconductor manufacture. Arrays of vertically-stacked electronic devices may, for example, be constructed individually or in a crossbar arrangement. Individual vertically-stacked electronic devices in arrays may be electrically isolated from one another and may be electrically addressed independently in certain embodiments. Various techniques may be used for constructing crossbar arrays such as, for example, lithography, electron-beam lithography, imprinting, embossing, stamping, micro-contact printing, and nano-contact printing. Arrays may be used as multi-bit memory devices, wherein the individual vertically-stacked electronic devices (memory elements or bits) are addressed individually. Arrays may also be used, for example, as sensors and logic switches.

In typical embodiments, arrays may be constructed from vertically-stacked electronic devices having two electrode terminals. In various embodiments, arrays comprising a plurality of vertically-stacked electronic devices are described. Each of the plurality of the vertically-stacked electronic devices comprises two electrode terminals and a carbon film. The carbon film comprises at least two graphitic layers. At least a portion of the carbon film lies between the two electrode terminals. The carbon film is in electrical contact with the two electrode terminals. Each of the plurality of the vertically-stacked electronic devices exhibits nonlinear current-versus-voltage response when operated over a voltage sweep range. Each of the plurality of the vertically-stacked electronic devices is electrically addressed independently. In various embodiments of the arrays, the at least two graphitic layers comprise a discontinuous carbon film. In various embodiments of the arrays, the discontinuous carbon film comprises a material selected from a group consisting of graphene, graphite, and combinations thereof. Graphene and graphite refer to a graphitic layer in the vertically-stacked electronic devices. In various embodiments of the arrays, the carbon film is deposited by a technique selected from a group consisting of chemical vapor deposition and carbon atom sputtering.

In various embodiments of the arrays, each of the plurality of the vertically-stacked electronic devices further comprises at least one dielectric material. In some embodiments of the arrays, the at least one dielectric material lies between at least a portion of the carbon film and at least a portion of at least one of the two electrode terminals. In various embodiments of the arrays, the at least one dielectric material is selected from a group consisting of silicon dioxide, silicon nitride, aluminum oxide, titanium nitride, glass, plastic, and combinations thereof. In various embodiments of the arrays, the two electrode terminals comprise at least one material selected from a group consisting of silicon, silicon carbide, gallium arsenide, platinum, palladium, aluminum, copper, tin, gold, silver, titanium, chromium, tungsten, and combinations thereof. The selection of the at least one material is conducted independently for each of the two electrode terminals.

The individual vertically-stacked electronic devices in the arrays are electrically addressed independently of one another. In some embodiments, the individual vertically-stacked electronic devices are electrically isolated from one another. For example, individual vertically-stacked electronic devices can be separated by a dielectric barrier. As such, the individual vertically-stacked electronic devices may be addressed independently by completing a circuit to each device. In other various embodiments, the individual vertically-stacked electronic devices are interconnected by arrays of nanowires. By setting appropriate voltages in individual nanowires of the nanowire arrays, the individual vertically-stacked electronic devices may be electrically addressed independently of one another.

In various embodiments of the arrays, the vertically-stacked electronic devices comprise two-terminal memory devices, each having an ON/OFF memory state. In such embodiments, the arrays comprise multi-bit memory devices. The individual vertically-stacked electronic devices (memory bits) in the arrays may be placed in either an ON or an OFF state. Such ON/OFF behavior provides the basis for binary programming. As discussed hereinabove, the vertically-stacked electronic devices confer inherent advantages for producing densely-packed arrays. High-density memory devices, such as those provided by the arrays of vertically-stacked electronic devices, would find utility in the production of smaller and faster computers. In other embodiments of the arrays, the vertically-stacked electronic devices comprise logic switches.

In various embodiments of the arrays, the vertically-stacked electronic devices comprise sensors. A detailed description concerning use of the vertically-stacked electronic devices in sensor applications has been provided hereinabove. In arrays of the vertically-stacked electronic devices, the individual electronic devices may be constructed such that they all sense the same analyte. In some embodiments, at least a portion of the vertically-stacked electronic devices may be constructed such that they have varying affinities for different analytes. Affinity for different analytes may be conferred, for example, by covalent attachment of various groups to the carbon film of individual vertically-stacked electronic devices. Having multiple sensors in the arrays may also provide higher sensing sensitivity than is possible when a single vertically-stacked electronic device is used alone.

In various embodiments of the arrays, each of the plurality of the vertically-stacked electronic devices is constructed atop a substrate. An illustrative substrate comprises, for example, a dielectric material. In various other embodiments of the arrays, the vertically-stacked electronic devices are constructed below the surface of a substrate. For example, the vertically-stacked electronic devices may be assembled in a plurality of holes or depressions formed in the substrate. The advantages and utility of assembling the vertically-stacked electronic devices in holes or depressions will be evident to one having skill in the art of assembling electronic devices.

To assemble an array of vertically-stacked electronic devices below the surface of a substrate, a plurality of holes or depressions is formed in the substrate. The substrate may first be covered with an dielectric layer such as, for example, $Al_2O_3$ prior to patterning the plurality of holes or depressions. Patterning may be accomplished by lithography techniques, for example. Subsequently, layers of materials comprising the vertically-stacked electronic devices are deposited in the holes or depressions located on the substrate. Deposition of the vertically-stacked electronic device layers takes place using the illustrative techniques described hereinabove. Polishing of the array may be performed, for example, after any of the deposition steps. In certain embodiments of the arrays, the vertically-stacked electronic devices may at least partially extend above the surface of the substrate. In other embodiments of the arrays, the vertically-stacked electronic devices are located entirely below the surface of the substrate.

Other various embodiments of arrays having a plurality of vertically-stacked electronic devices are described. In typical embodiments, arrays may be constructed from vertically-stacked electronic devices displaying conduction along a carbon film plane parallel to a vertical axis of the vertically-stacked electronic device. In various embodiments, arrays comprising a plurality of vertically-stacked electronic devices are described. Each of the plurality of the vertically-stacked electronic devices comprises a first electrode terminal, a carbon film comprising at least two graphitic layers, and at least one dielectric material. The carbon film comprises a second electrode terminal. The at least one dielectric material lies between at least a portion of the first electrode terminal and at least a portion of the carbon film. Each of the plurality of the vertically-stacked electronic devices exhibits nonlinear current-versus-voltage response when operated over a voltage sweep range. Each of the plurality of the vertically-stacked electronic devices is electrically addressed independently. In various embodiments of the arrays, the at least two graphitic layers comprise a discontinuous carbon film. In various embodiments of the arrays, the discontinuous carbon film comprises a material selected from a group consisting of graphene, graphite, and combinations thereof. Graphene and graphite refer to a graphitic layer in the vertically-stacked electronic devices. In various embodiments of the arrays, the carbon film is deposited by a technique selected from a group consisting of chemical vapor deposition and carbon atom sputtering.

In various embodiments of arrays, the at least one dielectric material is selected from a group consisting of silicon dioxide, silicon nitride, aluminum oxide, titanium nitride, glass, plastic, and combinations thereof. In various embodiments of the arrays, the first electrode terminal comprises at least one material selected from a group consisting of silicon, silicon carbide, gallium arsenide, platinum, palladium, aluminum, copper, tin, gold, silver, titanium, chromium, tungsten, and combinations thereof.

The individual vertically-stacked electronic devices are electrically addressed independently of one another. In some embodiments, the individual vertically-stacked electronic devices are electrically isolated from one another. For example, individual vertically-stacked electronic devices can be separated by a dielectric barrier. As such, the individual vertically-stacked electronic devices may be addressed independently by completing a circuit to each device. In other various embodiments, the individual vertically-stacked electronic devices are interconnected by arrays of nanowires. By setting appropriate voltages in individual nanowires of the nanowire arrays, the individual vertically-stacked electronic devices may be electrically addressed independently of one another.

In various embodiments of the arrays, the vertically-stacked electronic devices comprise two-terminal memory devices having an ON/OFF memory state. In such embodiments, the arrays comprise multi-bit memory devices. The individual vertically-stacked electronic devices (memory bits) in the array may be placed in either an ON or an OFF state to provide a basis for binary programming. In various embodiments of the arrays, the vertically-stacked electronic devices comprise sensors. In various embodiments of the arrays, the vertically-stacked electronic devices comprise logic switches. Illustrative variations and advantages of the vertically-stacked electronic devices have been discussed in more detail hereinabove where the vertically-stacked electronic devices are used as memory devices, sensors, and logic switches.

In various embodiments of the arrays, each of the plurality of the vertically-stacked electronic devices are constructed atop a substrate. An illustrative substrate comprises, for example, a dielectric material. In various other embodiments of the arrays, the vertically-stacked electronic devices are constructed below the surface of a substrate. For example, the vertically-stacked electronic devices may be assembled in a plurality of holes or depressions formed in a substrate. Particular considerations and advantages of constructing the arrays of vertically-stacked electronic devices in holes or depressions have been described in more detail hereinabove.

In still other various embodiments, crossbar arrays of vertically-stacked electronic devices are described. The crossbar arrays comprise at least one layer comprising a carbon film and at least two nanowire layers. The carbon film comprises at least two graphitic layers. The nanowire layers comprise a plurality of parallel nanowires. A first plurality of parallel nanowires in a first nanowire layer is orthogonal to a second plurality of parallel nanowires in alternating nanowire layers. The plurality of parallel nanowires is in electrical contact with the at least one layer comprising a carbon film. The at least one layer comprising a carbon film and the at least two nanowire layers comprise a plurality of vertically-stacked electronic devices. Each of the plurality of the vertically-stacked electronic devices exhibits nonlinear current-versus-voltage response when operated over a voltage sweep range. In various embodiments of the crossbar arrays, the at least two graphitic layers comprise a discontinuous carbon film. In various embodiments of the crossbar arrays, the discontinuous carbon film comprises a material selected from a group consisting of graphene, graphite, and combinations thereof. Graphene and graphite refer to a graphitic layer in the vertically-stacked electronic devices. In various embodiments of the crossbar arrays, the at least one layer comprising a carbon film is deposited by a technique selected from a group consisting of chemical vapor deposition and carbon atom sputtering.

In various embodiments of the crossbar arrays, the crossbar arrays further comprise at least one layer comprising at least one dielectric material. In some embodiments of the crossbar arrays, the at least one layer comprising at least one dielectric material lies between at least a portion of the at least one layer comprising a carbon film and at least a portion of at least one of the at least two nanowire layers. In various embodiments of the crossbar arrays, the at least one dielectric material is selected from a group consisting of silicon dioxide, silicon nitride, aluminum oxide, titanium nitride, glass, plastic, and combinations thereof.

In various embodiments of the crossbar arrays, the at least two nanowire layers comprise at least one material selected from a group consisting of silicon, silicon carbide, gallium arsenide, platinum, palladium, aluminum, copper, tin, gold, silver, titanium, chromium, tungsten, and combinations thereof. The selection of the at least one material is conducted independently for each of the at least two nanowire layers.

In various embodiments of the crossbar arrays, the vertically-stacked electronic devices comprise two-terminal memory devices, each having an ON/OFF memory state. In such embodiments, the arrays comprise multi-bit memory devices. In some embodiments of the crossbar arrays, the ON/OFF memory state is set and read by setting at least one voltage in the at least two nanowire layers. Voltages are set in the individual nanowires of the nanowire layers to control the ON/OFF memory state of the individual vertically-stacked electronic devices. In various embodiments of the crossbar arrays, the vertically-stacked electronic devices comprise sensors. In various embodiments of the crossbar arrays, the vertically-stacked electronic devices comprise logic switches. Illustrative advantages and variations of the vertically-stacked electronic devices have been discussed in more detail hereinabove when the vertically-stacked electronic devices are used as memory devices, sensors, and logic switches.

Voltages may be established independently in the individual nanowires of the plurality of parallel nanowires in each nanowire layer. Operating voltages in the nanowires may be used for setting an operating state of the individual vertically-stacked electronic devices in the crossbar arrays. For example, a nanowire forming a first electrode terminal of a vertically-stacked electronic device may be used to set the device to a high or low conduction state through an applied bias voltage, and a nanowire forming a second electrode terminal of the vertically-stacked electronic device may be used to return the device to the opposite state through a second applied voltage. The orthogonal arrangement of the parallel nanowire layers allows the various vertically-stacked electronic devices to be electrically addressed independently of one another. In the crossbar arrays, a plurality of vertically-stacked electronic devices are stacked perpendicular to the longitudinal axis of a single nanowire. Thus, in various embodiments of the crossbar arrays, a single nanowire comprises a first electrode terminal for a plurality of vertically-stacked electronic devices perpendicular to a longitudinal axis of the single nanowire. All of the vertically-stacked electronic devices formed along a single nanowire experience the same bias voltage applied to the nanowire. However, since the second electrode terminals of the vertically-stacked electronic devices are formed from orthogonal nanowires, vertically-stacked electronic devices along a single nanowire row can be individually subjected to a variety of switching voltages by judicious selection of the operating voltages in the various nanowires.

Figure 5:
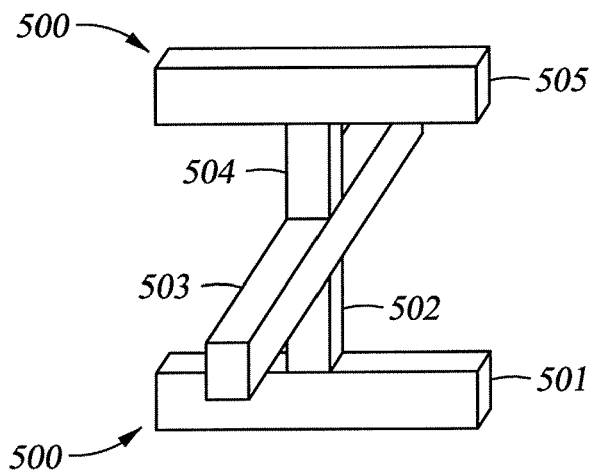
FIG. 5 presents a schematic illustration of a multiple layer crossbar array.

The crossbar arrays may have multiple layers of vertically-stacked electronic devices. FIG. 5 presents a schematic illustration of a multiple layer crossbar array. For example, a crossbar array having a first nanowire layer 501, a first carbon film layer 502 and a second nanowire layer 503 may have a second carbon film layer 504 deposited on the second nanowire layer 503. A third nanowire layer 505 may then be deposited upon the second carbon film layer 504 to provide a second layer of vertically-stacked electronic devices 500. The crossbar array illustrated in FIG. 5 is meant to be illustrative only and should not be considered limiting.

Figure 6:
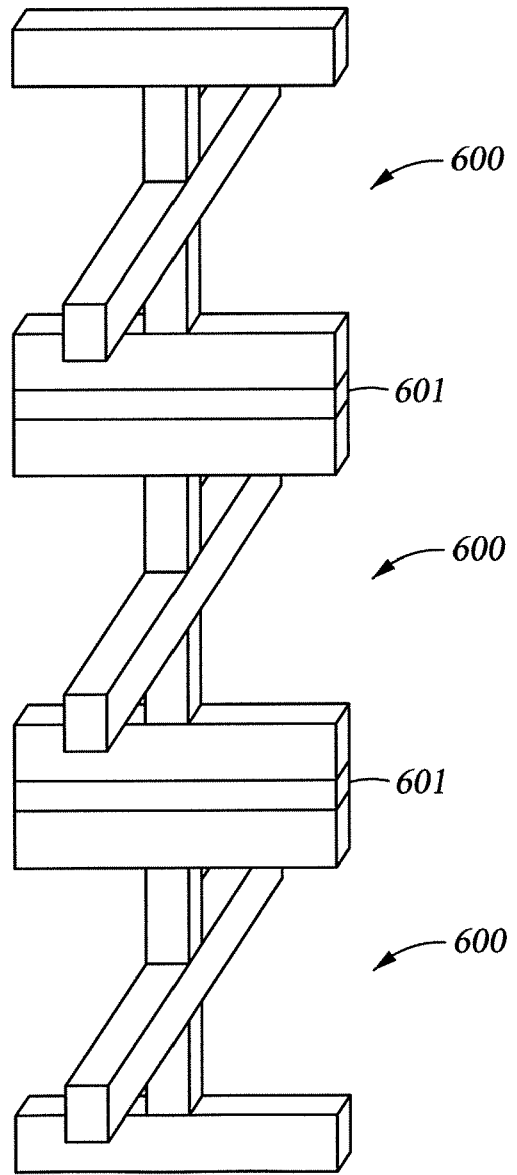
FIG. 6 presents a schematic illustration of a multiple layer crossbar array having an insulating layer between certain nanowire layers.

Repeated vertical stacking of the vertically-stacked electronic devices in crossbar arrays may be conducted by repeating the layering steps. For example, FIG. 6 presents a schematic illustration of a multiple layer crossbar array having an insulating layer between certain nanowire layers. In the non-limiting example shown in FIG. 6, an insulating dielectric layer 601 is placed between some of the vertically-stacked electronic device layers 600. In various embodiments of the crossbar arrays, at least a portion of the nanowire layers comprise a first electrode terminal for a first plurality of vertically-stacked electronic devices located below the nanowire layers and for a second plurality of vertically-stacked electronic devices located above the nanowire layers. Construction of the crossbar arrays wherein a single nanowire layer serves as an electrode terminal for two vertically-stacked electronic device layers advantageously allows for more dense packing of the array.

In various embodiments of the crossbar arrays, the crossbar arrays further comprise diodes between vertically-stacked electronic devices constructed in series. Use of a diode between vertically-stacked electronic devices connected in series is advantageous for reducing crosstalk between neighboring vertically-stacked electronic devices and for reducing leakage current during operation of the vertically-stacked electronic devices. The diodes between vertically-stacked electronic devices connected in series may be deposited as additional layers of the crossbar arrays.

EXPERIMENTAL EXAMPLES

The following experimental examples are included to demonstrate particular aspects of the present disclosure. It should be appreciated by those of skill in the art that the methods described in the examples that follow merely represent exemplary embodiments of the disclosure. Those of skill in the art should, in light of the present disclosure, appreciate that many changes can be made in the specific embodiments described and still obtain a like or similar result without departing from the spirit and scope of the present disclosure.

Unless stated otherwise below, all electrical property measurements were taken at room temperature under a vacuum of ~5×10$^{-5}$ mm Hg. Electrical transport properties were measured using a Desert Cryogenics TT-probe 6 system. Current-voltage data were collected with an Agilent 4155C semiconductor parameter analyzer. SEM characterization was accomplished with a JEOL-6500 field emission SEM.

Example 1

Pt—C-p$^{++}$-Si Vertically-Stacked Electronic Devices

Fabrication: On a wafer of highly-doped silicon, graphitic layers were deposited via high temperature decomposition of $C_2H_2/H_2$ for 3-5 minutes at 900° C. Platinum electrodes were then deposited on the graphitic layers by standard lithography techniques. A schematic illustration of an array comprising this vertically-stacked electronic device has been presented hereinabove in FIGS. 3A and 3B.

Figure 7:
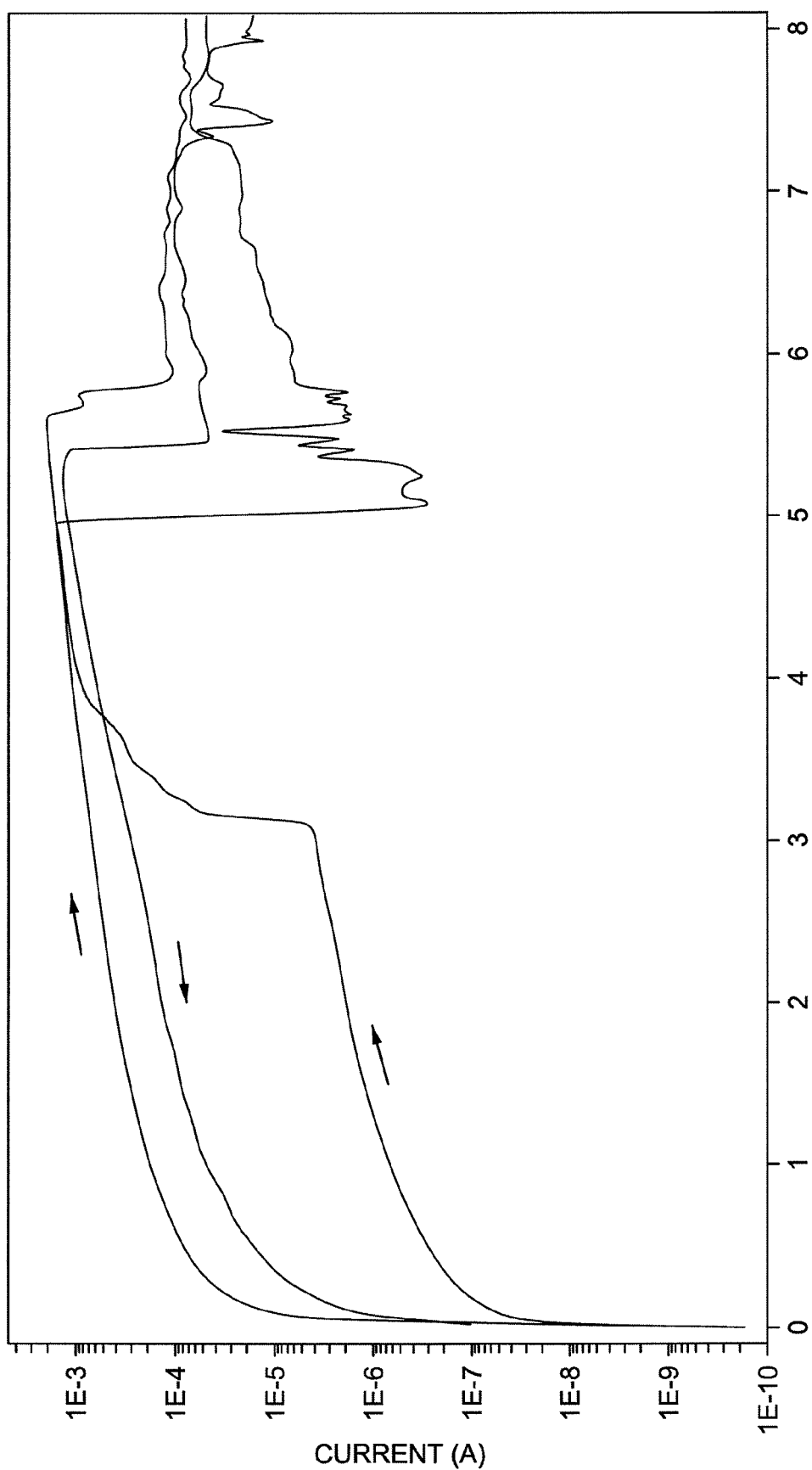
FIG. 7 illustrates BIV behavior for a Pt—C-$p^{++}$-Si vertically-stacked electronic device over two bias sweep cycles.
Figure 8:
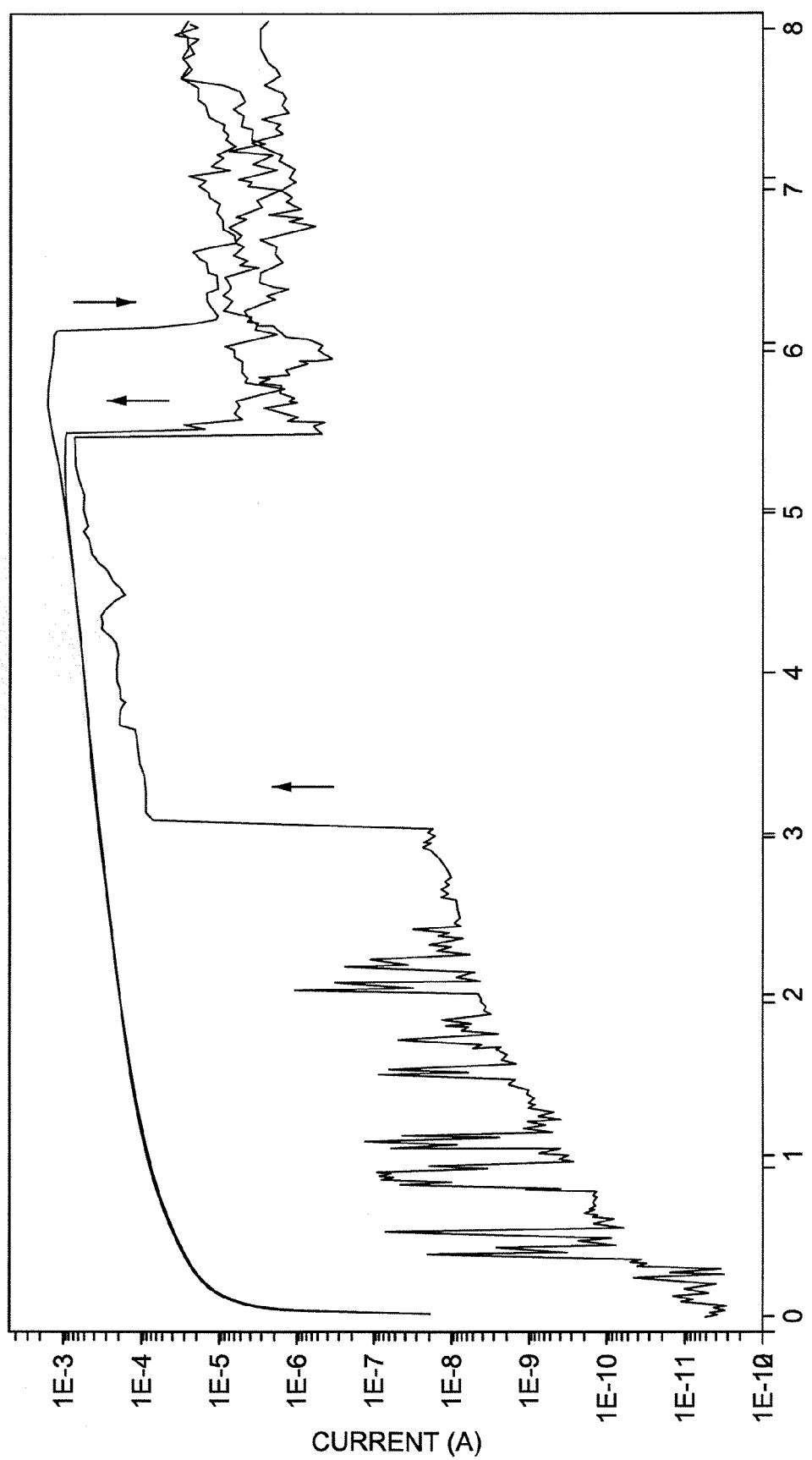
FIG. 8 illustrates BIV behavior for a second Pt—C-$p^{++}$-Si vertically-stacked electronic device over two bias sweep cycles.

BIV Behavior: Two Pt—C-p$^{++}$-Si vertically-stacked electronic devices selected from the array exhibited BIV behavior as shown in FIGS. 7 and 8. The devices were in a high conduction state during a first bias sweep from 0 to +8 V, until a $V_{th}$ of about +6 V was reached. During a second bias sweep from 0 to +8 V, the devices were initially in a low conduction state until a voltage of about +3 V was reached. The devices then were in a high conduction state until a voltage of about +6 V was reached, where the device returned to a low conduction state.

Figure 9:
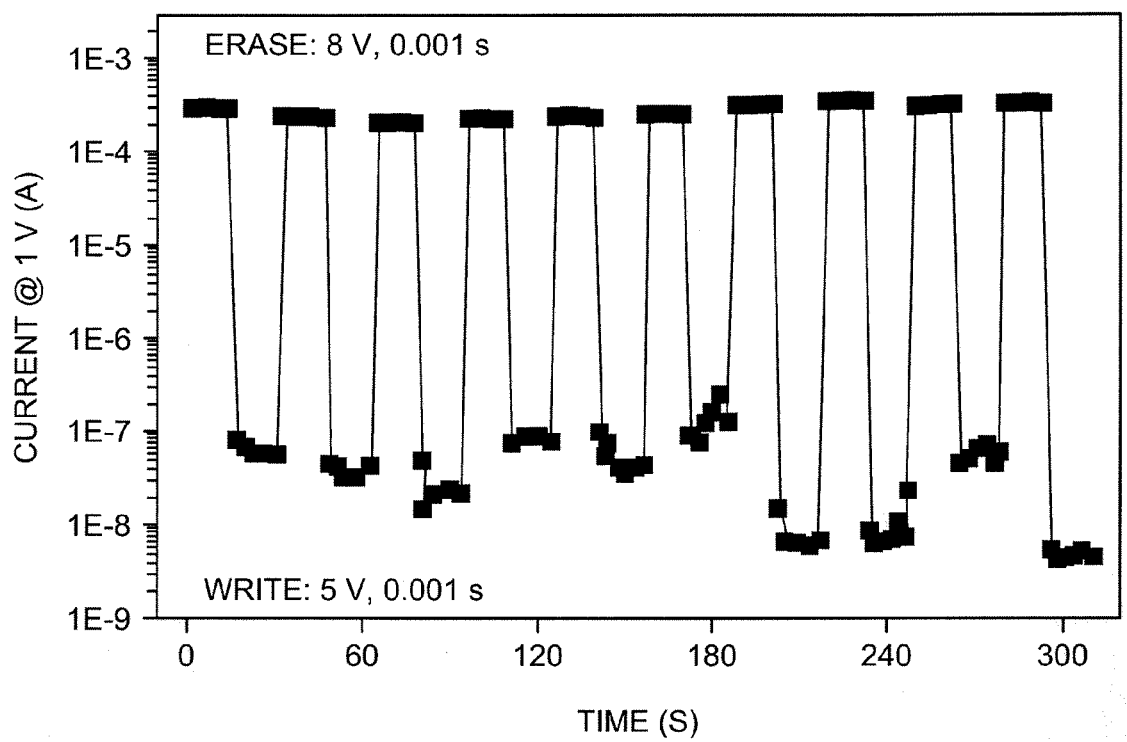
FIG. 9 illustrates memory switching performance for a Pt—C-$p^{++}$-Si vertically-stacked electronic device with a write bias pulse of +4 V for 1 ms and an erase bias pulse of +8 V for 1 ms.
Figure 10:
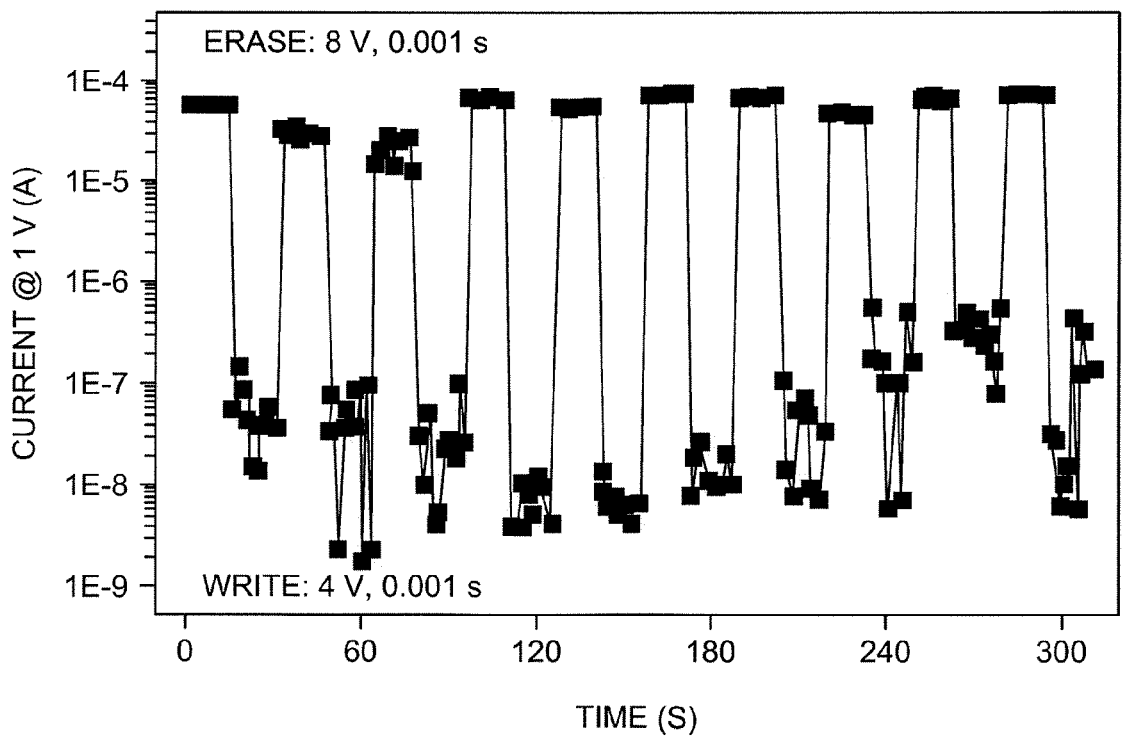
FIG. 10 illustrates memory switching performance for a second Pt—C-$p^{++}$-Si vertically-stacked electronic device with a write bias pulse of +4 V for 1 ms and an erase bias pulse of +8 V for 1 ms.

Memory Properties: Memory properties of the two Pt—C-p$^{++}$-Si vertically-stacked electronic devices are shown in FIGS. 9 and 10. The vertically-stacked electronic devices were written with a bias pulse of +4 V for 1 ms and erased with a bias pulse of +8 V for 1 ms. The vertically-stacked electronic devices showed performance stability over several read-erase cycles.

Example 2

C—Cr—SiO$_2$-p$^{++}$-Si Vertically-Stacked Electronic Devices

Fabrication: An array of C—Cr—SiO$_2$-p$^{++}$-Si vertically-stacked electronic devices was fabricated as follows: On a wafer of highly-doped silicon covered with a 200 nm thick SiO$_2$ layer, a patterned array of Cr pads (50 μm×50 μm×50 nm) was fabricated by standard photolithography techniques. The spacing between pads was about 8 μm. The SiO$_2$ was then etched away from the areas not covered by the Cr pads through wet etching techniques, forming SiO$_2$ platforms (50 μm×50 μm×200 nm) underneath the Cr pads. A thin carbon film of graphitic layers was then deposited atop the wafer via high-temperature decomposition of $C_2H_2/H_2$ for 1 min at 600° C. in a tube furnace. A schematic illustration of an individual C—Cr—SiO$_2$-p$^{++}$-Si vertically-stacked electronic device and a top view SEM image of a corresponding vertically-stacked electronic device array have been previously shown in FIGS. 1 and 2, respectively.

Figure 11:
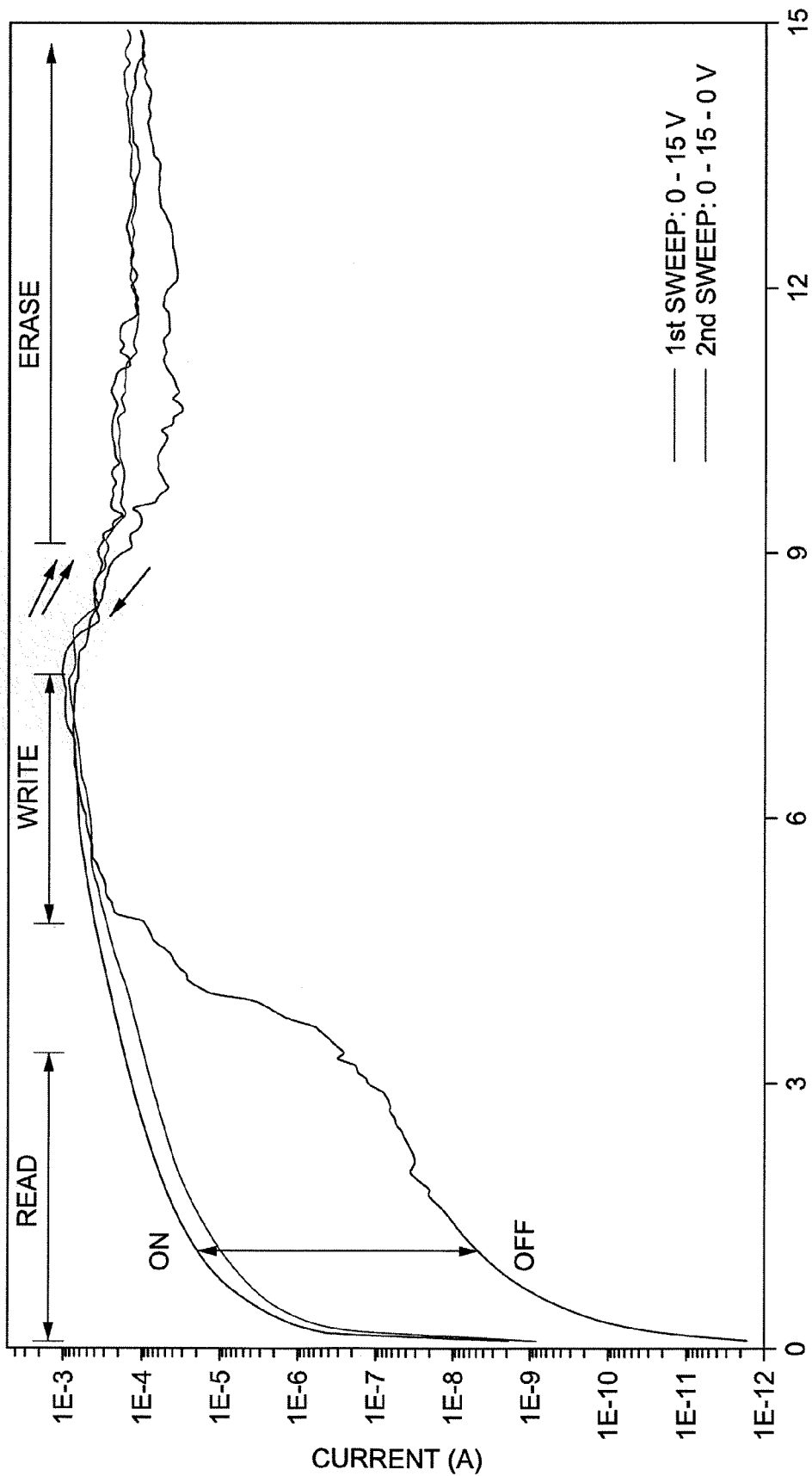
FIG. 11 illustrates BIV behavior for a C—Cr—$SiO_2$-$p^{++}$-Si vertically-stacked electronic device over two bias sweep cycles.

BIV Behavior: Testing of the vertically-stacked electronic devices was performed using two micron-manipulated W probes. One probe was connected to the highly-doped silicon substrate as a source electrode, and the other probe was connected to the graphitic layers as the drain electrode. The as-fabricated C—Cr—SiO$_2$-p$^{++}$-Si vertically-stacked electronic devices showed high currents (between a few μA to several hundred μA) at low bias (1 V). When higher bias voltages were applied, the C—Cr—SiO$_2$-p$^{++}$-Si vertically-stacked electronic devices exhibited BIV behavior. FIG. 11 shows the BIV behavior of a C—Cr—SiO$_2$-p$^{++}$-Si vertically-stacked device over a bias sweep range from 0 to +15 V. The vertically-stacked electronic device was initially in a high conduction state from 0 V to about +8.2 V over a first bias sweep. When the bias voltage increased over about +8.2 V, switching to a low conduction state occurred. Over a second bias sweep from 0 to +15 V, the vertically-stacked electronic device remained in a low conduction state until a bias voltage of about +5 V was reached. From about +5 V to about +8.2 V, the vertically-stacked electronic device was in a high conduction state, before returning to a low conduction state at higher bias voltages.

Figure 12:
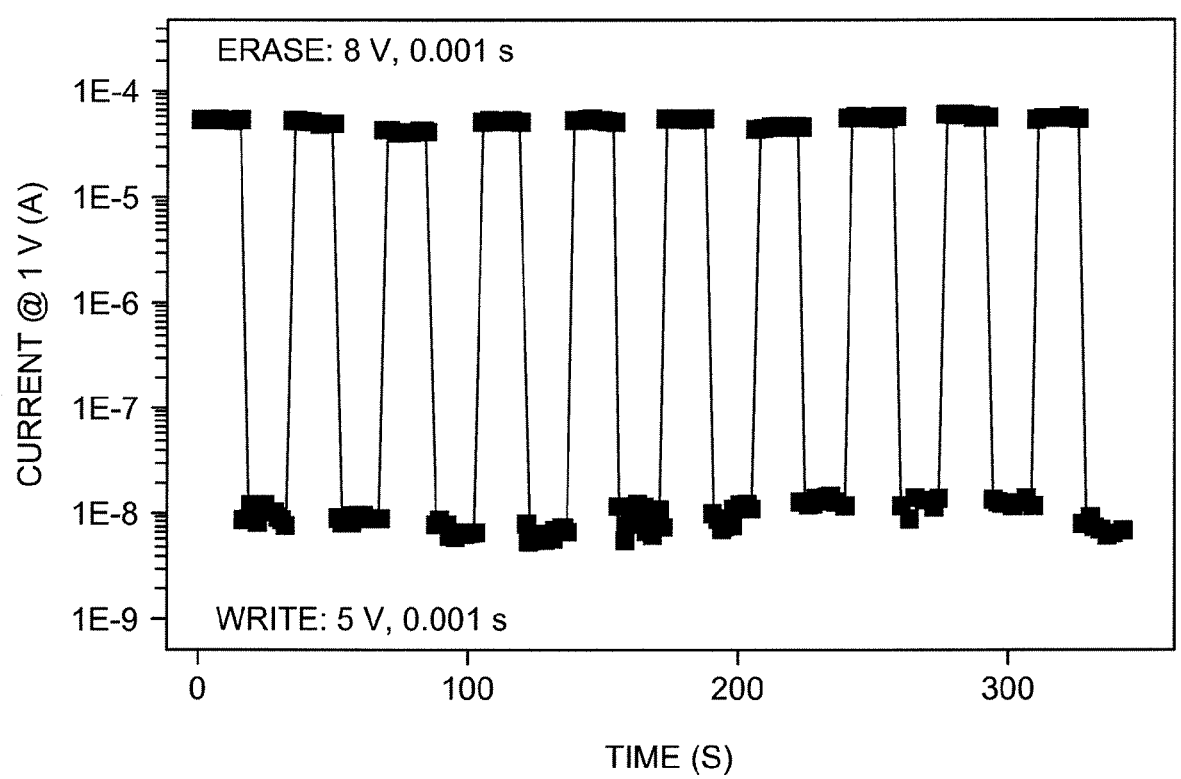
FIG. 12 illustrates memory switching performance for a C—Cr—$SiO_2$-$p^{++}$-Si vertically-stacked electronic device with a write bias pulse of +6 V for 1 ms and an erase bias pulse of +15 V for 1 ms.

Memory Properties: The C—Cr—SiO$_2$-p$^{++}$-Si vertically-stacked electronic devices showed memory effects. Instead of bias voltage sweeping, a bias pulse could be used to switch the vertically-stacked electronic devices between ON and OFF memory states at low bias. Typical memory performance using pulsed switching is shown in FIG. 12. The vertically-stacked electronic devices were written with a bias pulse of +6 V for 1 ms and erased with a bias pulse of +15 V for 1 ms. The ON/OFF ratios for over 100 devices tested ranged between about 100 and about 5000. The vertically-stacked electronic devices showed performance stability over several read-erase cycles.

Example 3

C—SiO$_2$-p$^{++}$-Si Vertically-Stacked Electronic Devices

Fabrication: SiO$_2$ pads (50 μm×50 μm×200 nm) were patterned on a highly-doped silicon wafer via standard photolithography and wet etching processing. The spacing between SiO$_2$ pads was about 10 μm. A thin carbon film of graphitic layers was then deposited atop the wafer via high-temperature decomposition of $C_2H_2/H_2$ for 2 min at 900° C. in a tube furnace. Some of the resulting vertically-stacked electronic devices were further annealed at 800° C. and at a pressure of 60 mtorr for 15 minutes.

Figure 13:
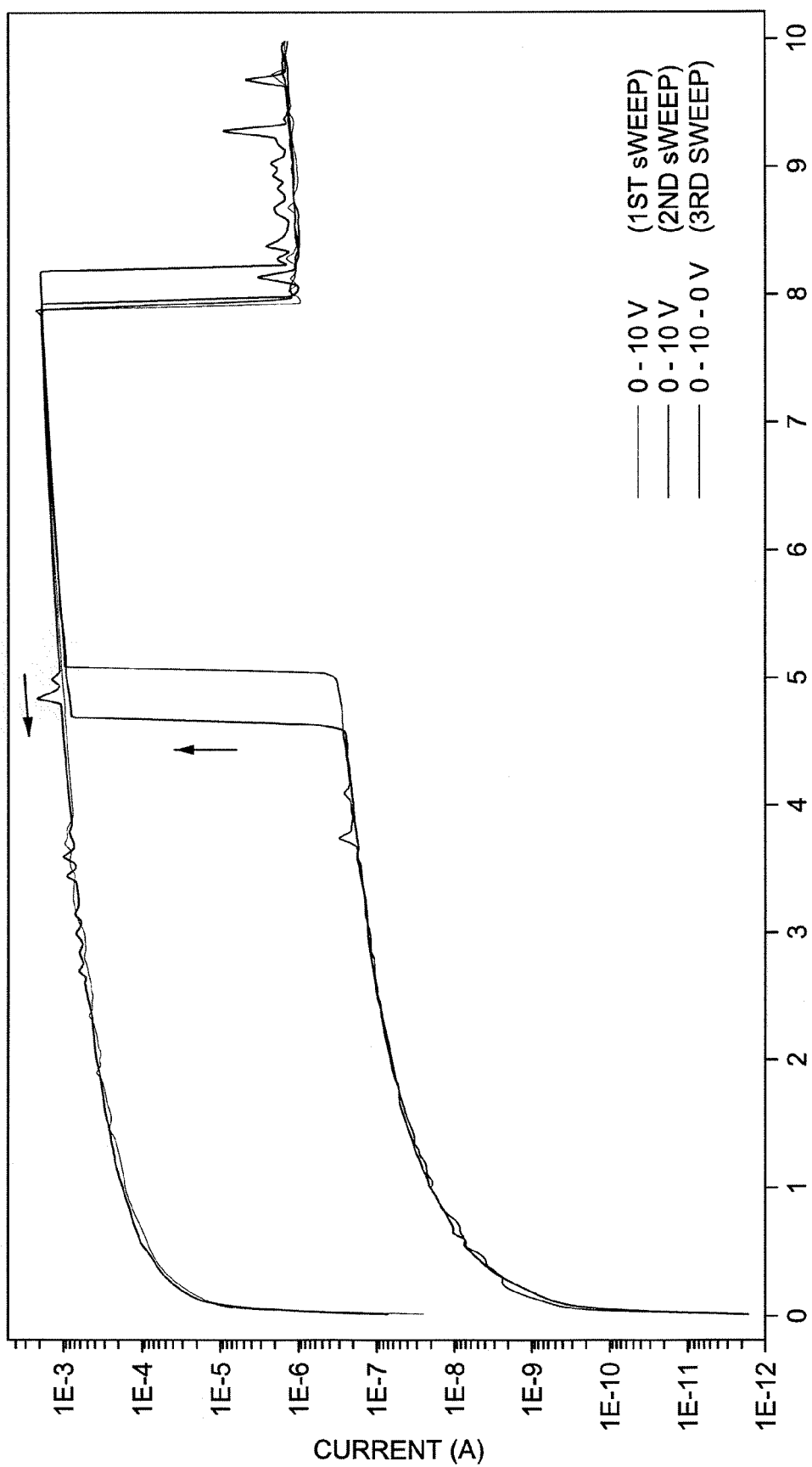
FIG. 13 illustrates BIV behavior for an un-annealed C—$SiO_2$-$p^{++}$-Si vertically-stacked electronic device over three bias sweep cycles.
Figure 14:
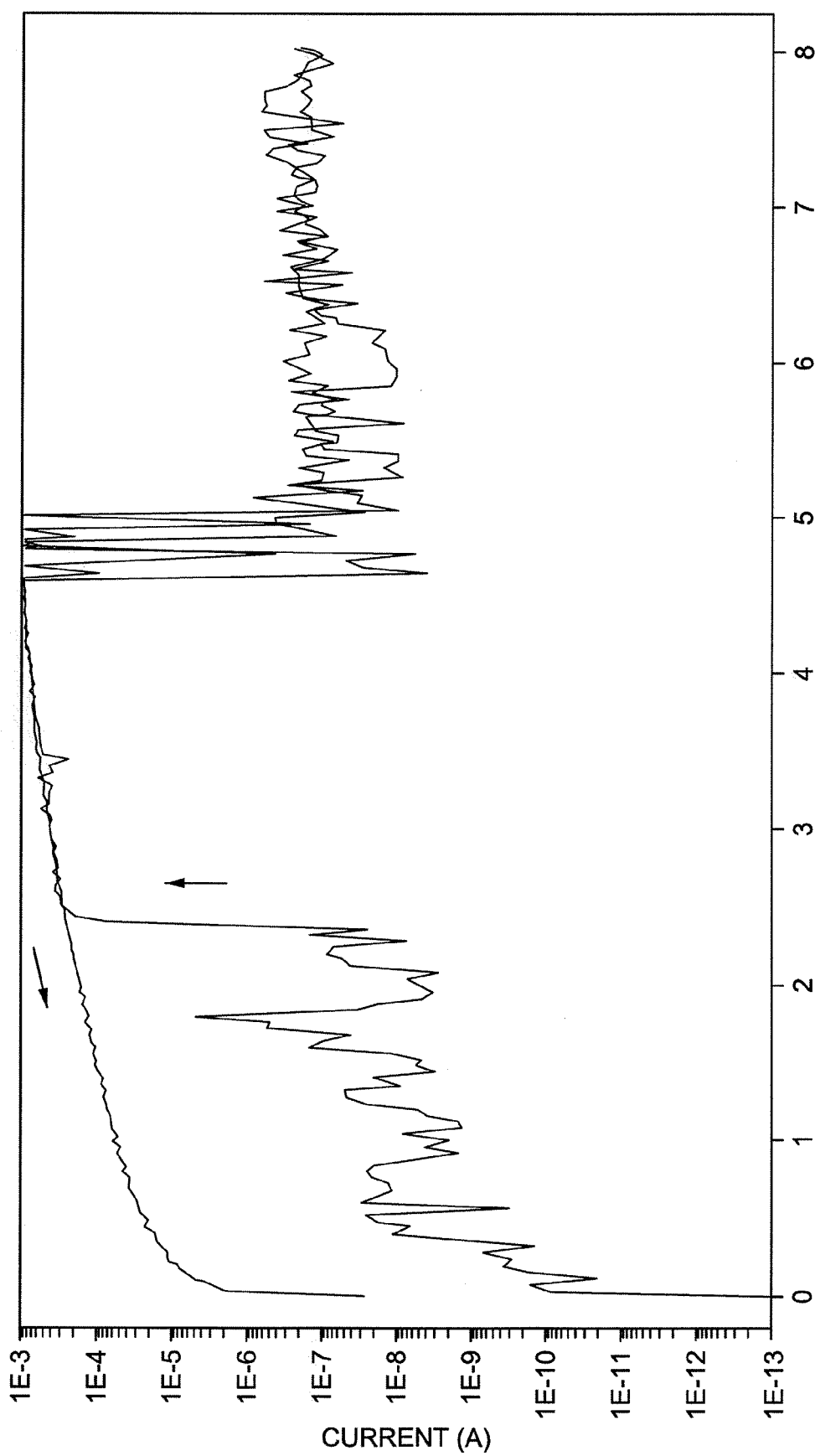
FIG. 14 illustrates BIV behavior for an annealed C—$SiO_2$-$p^{++}$-Si vertically-stacked electronic device over two bias sweep cycles.

BIV Behavior: The C—SiO$_2$-p$^{++}$-Si vertically-stacked electronic devices exhibited BIV behavior similar to that of C—Cr—SiO$_2$-p$^{++}$-Si vertically-stacked devices. FIGS. 13 and 14 show typical BIV characteristics of un-annealed and annealed C—SiO$_2$-p$^{++}$-Si vertically-stacked electronic devices, respectively. As shown in FIG. 13, the un-annealed vertically-stacked electronic device was in a high conduction state during a first bias sweep from 0 to +10 V, until a $V_{th}$ of about +8 V was reached. During a second bias sweep from 0 to +10 V, the vertically-stacked electronic device initially was in a low conduction state until a voltage of about +5 V was reached. The vertically-stacked electronic device remained in a high conduction state until a voltage of about +8 V was reached, where the vertically-stacked electronic device returned to a low conduction state. As shown in FIG. 14, the annealed vertically-stacked electronic device was in a high conduction state during a first bias sweep from 0 to +8 V, until a $V_{th}$ of about +5 V was reached. During a second bias sweep from 0 to +8 V, the vertically-stacked electronic device was initially in a low conduction state until a voltage of about +2.5 V was reached. The vertically-stacked electronic device then remained in a high conduction state until a voltage of about +5 V was reached, where the vertically-stacked electronic device returned to a low conduction state.

Figure 15:
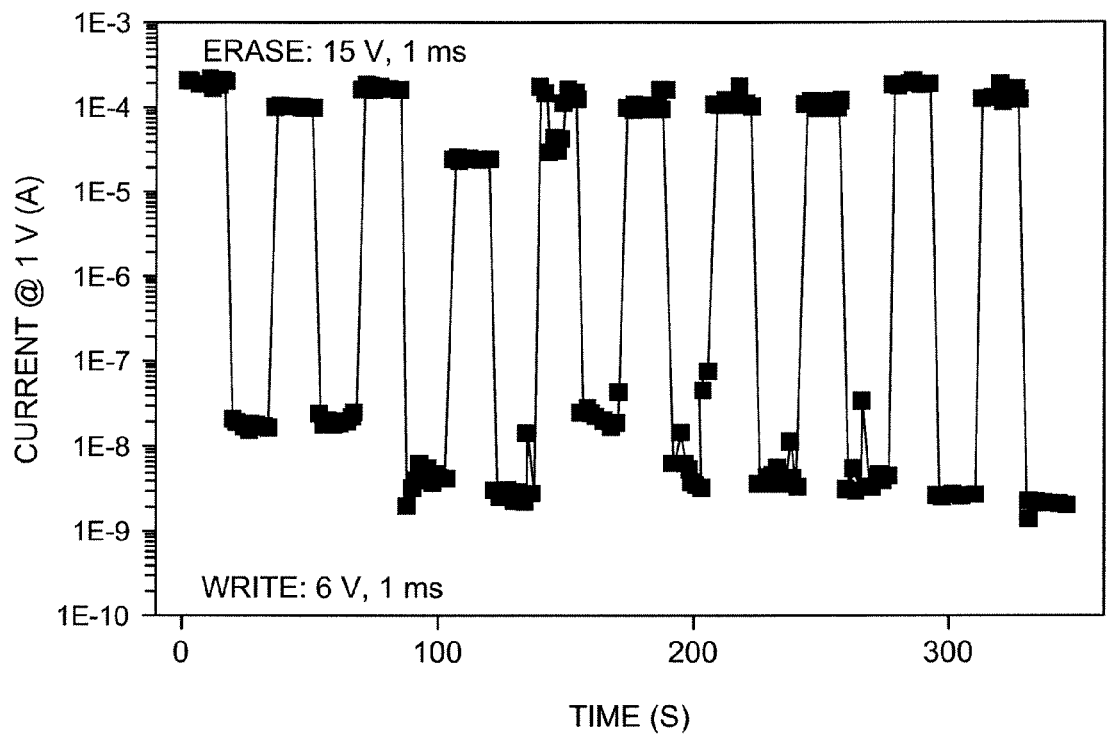
FIG. 15 illustrates memory switching performance for an un-annealed C—$SiO_2$-$p^{++}$-Si vertically-stacked electronic device with a write bias pulse of +6 V for 1 ms and an erase bias pulse of +15 V for 1 ms.
Figure 16:
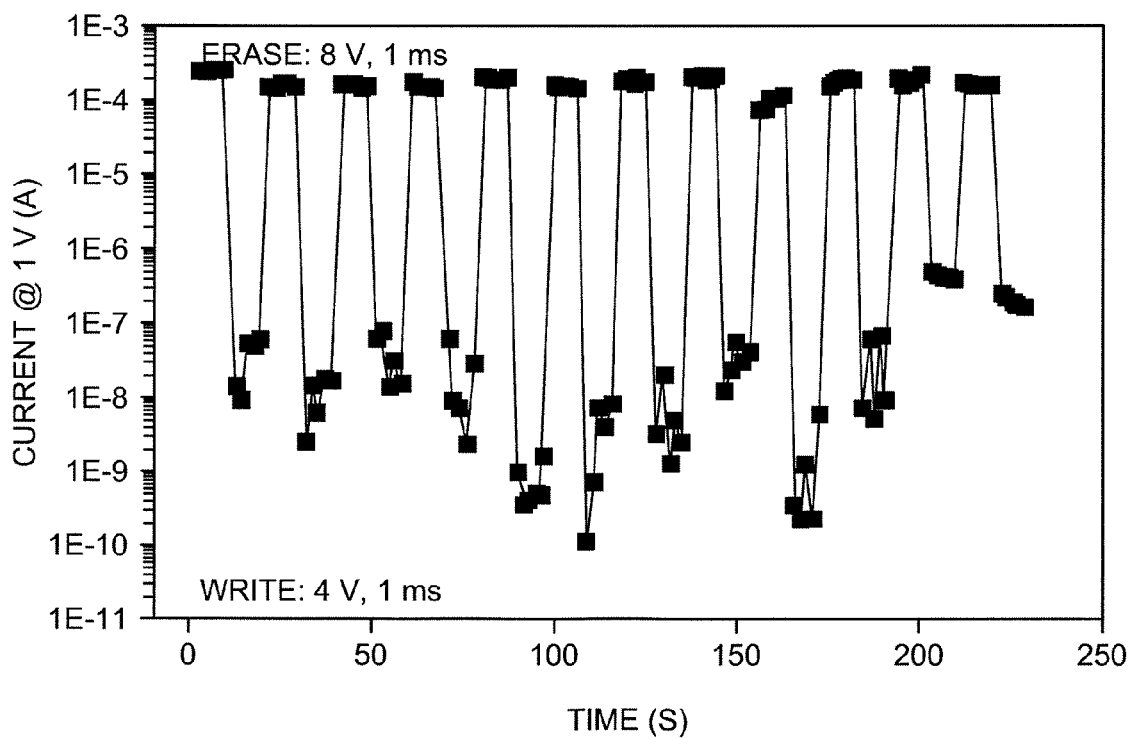
FIG. 16 illustrates memory switching performance for an annealed C—$SiO_2$-$p^{++}$-Si vertically-stacked electronic device with a write bias pulse of +4 V for 1 ms and an erase bias pulse of +8 V for 1 ms.

Memory Properties: Memory switching properties of un-annealed and annealed C—SiO$_2$-p$^{++}$-Si vertically-stacked electronic devices are shown respectively in FIGS. 15 and 16. The un-annealed device was written with a bias pulse of +6 V for 1 ms and erased with a bias pulse of +15 V for 1 ms. The annealed device was written with a bias pulse of +4 V for 1 ms and erased with a bias pulse of +8 V for 1 ms. The vertically-stacked electronic devices showed performance stability over several read-erase cycles.

Example 4

C—Cr—W—SiO$_2$-p$^{++}$-Si Vertically-Stacked Electronic Devices

Fabrication: A patterned array of W/Cr pads (50 μm×50 μm×50 nm) was fabricated on a wafer of highly-doped silicon covered with a 200 nm thick layer of SiO$_2$. Fabrication was conducted by standard photolithography techniques. The spacing between pads was about 10 μm. The SiO$_2$ was then etched away from areas not covered by W/Cr by wet etching, forming SiO$_2$ platforms (50 μm×50 μm×200 nm) underneath the W/Cr pads. A thin carbon film of graphitic layers was then deposited atop the wafer via high-temperature decomposition of C$_2$H$_2$/H$_2$ for 2 min at 700° C. in a tube furnace.

Figure 17:
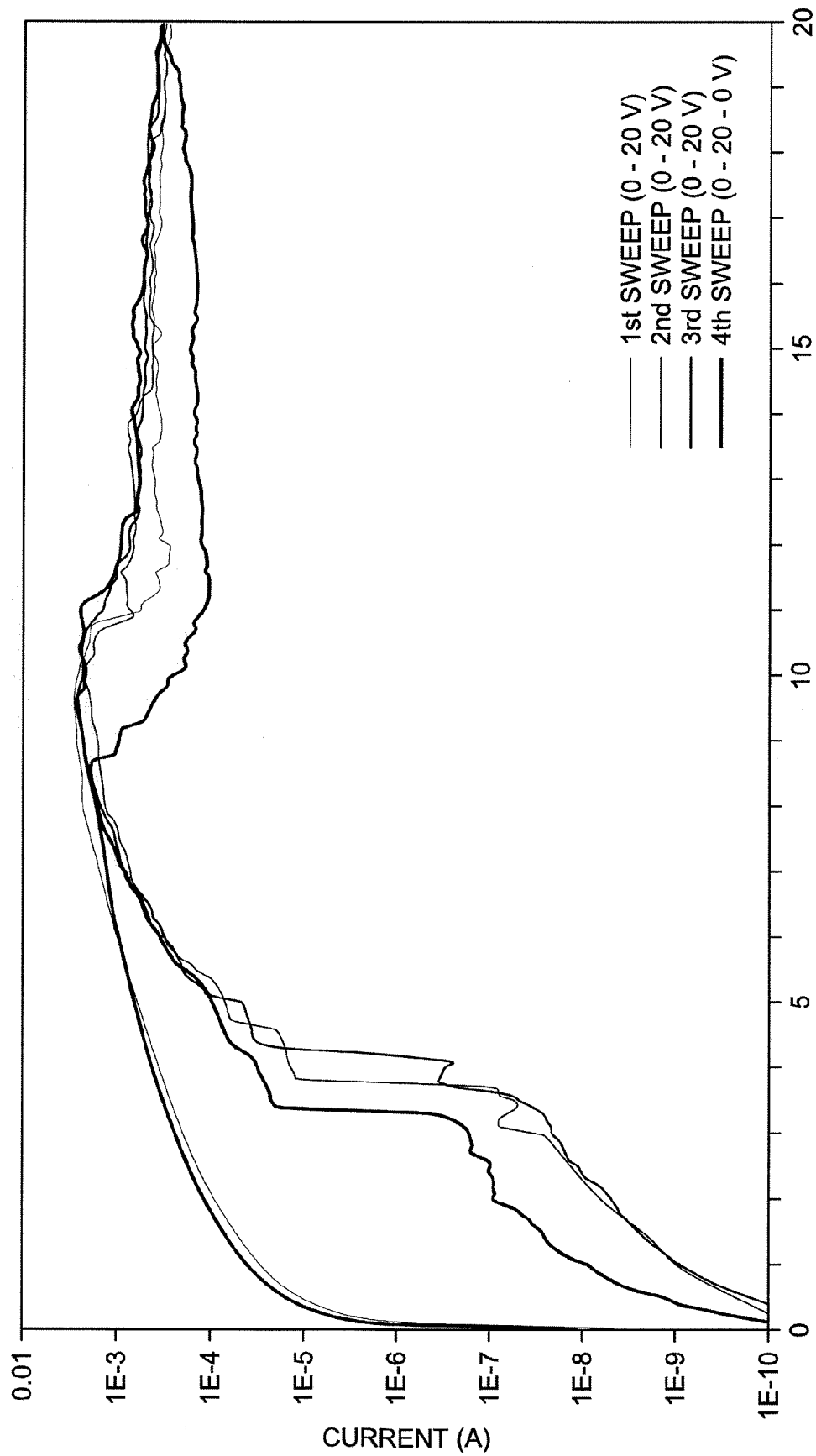
FIG. 17 illustrates BIV behavior for a C—Cr—W—$SiO_2$-$p^{++}$-Si vertically-stacked electronic device over four bias sweep cycles.

BIV Behavior: C—Cr—W—SiO$_2$-p$^{++}$-Si vertically-stacked electronic devices exhibited BIV behavior similar to that of C—Cr—SiO$_2$-p$^{++}$-Si vertically-stacked electronic devices. FIG. 17 shows typical BIV curves obtained over several consecutive bias sweep cycles from 0 to +20 V. As shown in FIG. 17, the vertically-stacked electronic device was initially in a high conduction state during a first bias sweep from 0 to +20 V, until a $V_{th}$ of about +8 V to +10 V was reached. The device then entered a lower conduction state. During a second and subsequent bias sweeps from 0 to +20 V, the vertically-stacked electronic device was initially in a low conduction state until a voltage of about +5 V was reached, where the vertically-stacked electronic device entered a high conduction state. The vertically-stacked electronic device then remained in a high conduction state until a voltage of about +8 V to +10 V was reached, where the vertically-stacked electronic device returned to a lower conduction state.

Figure 18:
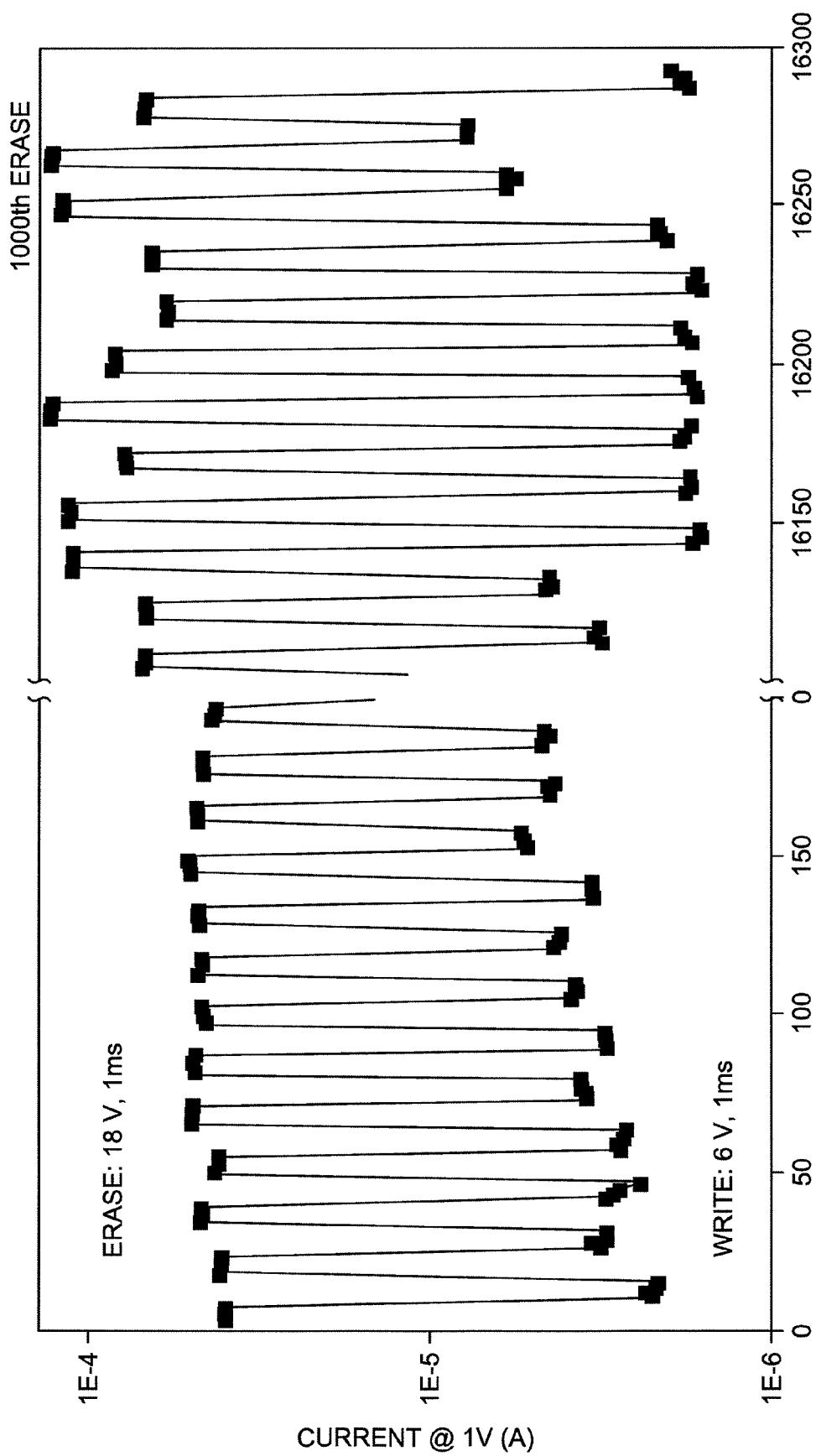
FIG. 18 illustrates memory switching performance for a C—Cr—W—$SiO_2$-$p^{++}$-Si vertically-stacked electronic device with a write bias pulse of +6 V for 1 ms and an erase bias pulse of +18 V for 1 ms.
Figure 19A:
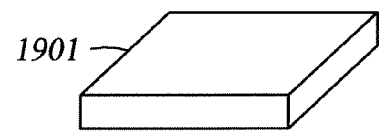
FIG. 19 illustrates a proposed fabrication method for a multiple-layer crossbar array of vertically-stacked electronic devices.
Figure 19B:
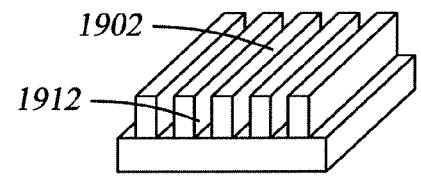
Figure 19C:
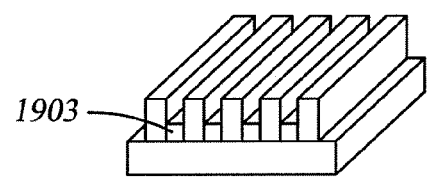
Figure 19D:
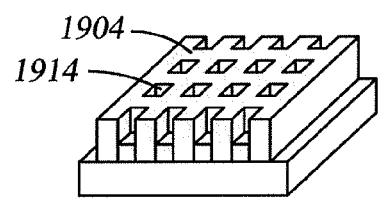
Figure 19E:
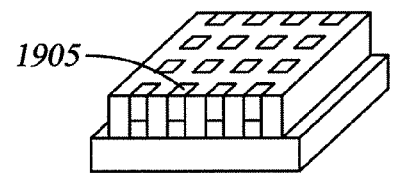
Figure 19F:
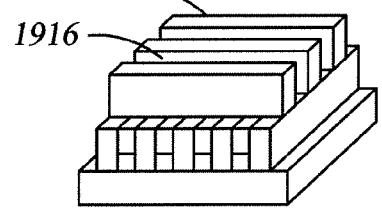
Figure 19G:
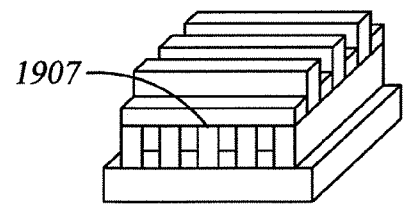

Memory Properties: Memory switching properties of a C—Cr—W—SiO$_2$-p$^{++}$-Si vertically-stacked electronic device are shown in FIG. 18. The vertically-stacked electronic device was written with a bias pulse of +6 V for 1 ms and erased with a bias pulse of +18 V for 1 ms. The vertically-stacked electronic device was subjected to >1000 write-read-erase-read cycles with no observable change in device performance.

Prophetic Example 1

Fabrication of a Crossbar Array of Vertically-Stacked Electronic Devices

Proposed fabrication of a crossbar array of vertically-stacked electronic devices is illustrated schematically in FIG. 19. A prepared substrate 1901 will be covered with an insulator layer 1902, such as Al$_2$O$_3$, to form a first set of parallel grooves 1912. Conductive material, such as Pt, will be deposited inside the first set of parallel grooves 1912 to form a layer of parallel conductive nanowires 1903. A second deposition of insulator, such as Al$_2$O$_3$, will be conducted and patterned to make an array of nanopores 1914 in completed insulator layer 1904. The nanopores 1914 will penetrate through the completed insulator layer 1904, exposing portions of the parallel nanowires 1903. A carbon film 1905 will then be deposited into the nanopores 1914 by high-temperature decomposition of C$_2$H$_2$/H$_2$. The carbon film 1905 in each nanopore 1914 will contact the exposed parallel nanowire 1903. A second insulator layer 1906, such as Al$_2$O$_3$, will then be patterned to form a second set of parallel grooves 1916 orthogonal to the first set of parallel grooves 1912. Conductive material, such as Pt, will be deposited in the second set of parallel grooves 1916 to form a second layer of parallel nanowires 1907. The second layer of parallel nanowires 1907 will contact the carbon film 1905 inside the nanopores 1914. The crossbar array produced as described hereinabove provides a single layer array of vertically-stacked electronic devices.

Multiple-layer crossbar arrays of vertically-stacked electronic devices will be prepared by depositing an insulator layer over the second layer of parallel nanowires 1907 and patterning to make an array of nanopores. A carbon film will be deposited into the nanopores by high-temperature decomposition of C$_2$H$_2$/H$_2$. Another layer of insulator will then be deposited on the carbon films to form a third set of parallel grooves orthogonal to the second set of parallel grooves 1916. Conductive material, such as Pt, will be deposited in the third set of parallel grooves to form parallel nanowires and complete a two-layer crossbar array of vertically-stacked electronic devices. These steps will be repeated to form higher-level crossbar arrays of vertically-stacked electronic devices. Optional insulator layers will be deposited between crossbar array layers. Optional diodes will be placed between layers of vertically-stacked electronic devices.

The crossbar arrays will be operated as multi-bit memory. Write, erase and read operations will be executed one bit a time. In other words, each vertically-stacked electronic device will be addressed independently. By applying a different voltage (write or erase) over two vertically-adjacent, orthogonal nanowires, each vertically-stacked electronic device will be addressed independently. Voltages for the nanowires will be carefully set to ensure that no voltage difference exists between the two terminals of each bit. Voltage choice will also be conducted to protect other bits from damage.

From the foregoing description, one skilled in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure, which is defined in the following claims.

What is claimed is the following:

1. A vertically-stacked electronic device comprising:
   two electrode terminals; and
   a carbon film comprising at least two graphitic layers;
      wherein at least a portion of the carbon film lies between the two electrode terminals; and
      wherein the carbon film is in electrical contact with the two electrode terminals; and
   wherein the vertically-stacked electronic device exhibits a bistable current-voltage response when operated over a voltage sweep range, wherein the bistable current-voltage response comprises between a $10^4$-fold to $10^9$-fold change in current over a voltage sweep range of 0.5 V.

2. The vertically-stacked electronic device of claim 1, wherein the at least two graphitic layers comprise a discontinuous carbon film.

3. The vertically-stacked electronic device of claim 2, wherein the discontinuous carbon film comprises a material selected from a group consisting of graphene, graphite, and combinations thereof.

4. The vertically-stacked electronic device of claim 1, further comprising at least one dielectric material.

5. The vertically-stacked electronic device of claim 4, wherein the at least one dielectric material lies between at least a portion of the carbon film and at least a portion of at least one of the two electrode terminals.

6. The vertically-stacked electronic device of claim 4, wherein the at least one dielectric material is selected from a group consisting of silicon dioxide, silicon nitride, aluminum oxide, titanium nitride, glass, plastic, and combinations thereof.

7. The vertically-stacked electronic device of claim 1, wherein the two electrode terminals comprise at least one material selected from a group consisting of silicon, silicon carbide, gallium arsenide, platinum, palladium, aluminum, copper, tin, gold, silver, titanium, chromium, tungsten and combinations thereof; and
wherein selection of the at least one material is conducted independently for each of the two electrode terminals.

8. The vertically-stacked electronic device of claim 1, wherein the carbon film is deposited by a technique selected from a group consisting of chemical vapor deposition and carbon atom sputtering.

9. The vertically-stacked electronic device of claim 1, wherein the vertically-stacked electronic device comprises a two-terminal memory device having an ON/OFF memory state.

10. The vertically-stacked electronic device of claim 1, wherein the vertically-stacked electronic device comprises a sensor.

11. The vertically-stacked electronic device of claim 1, wherein the vertically-stacked electronic device comprises a logic switch.

12. The vertically-stacked electronic device of claim 1, wherein the vertically-stacked electronic device is constructed atop a substrate.

13. A vertically-stacked electronic device comprising:
a first electrode terminal;
a carbon film comprising at least two graphitic layers;
wherein the carbon film comprises a second electrode terminal; and
at least one dielectric material;
wherein the at least one dielectric material lies between at least a portion of the first electrode terminal and at least a portion of the carbon film; and
wherein the vertically-stacked electronic device exhibits a bistable current-voltage response when operated over a voltage sweep range, wherein the bistable current-voltage response comprises between a $10^4$-fold to $10^9$-fold change in current over a voltage sweep range of 0.5 V.

14. The vertically-stacked electronic device of claim 13, wherein the at least two graphitic layers comprise a discontinuous carbon film.

15. The vertically-stacked electronic device of claim 14, wherein the discontinuous carbon film comprises a material selected from a group consisting of graphene, graphite, and combinations thereof.

16. The vertically-stacked electronic device of claim 13, wherein the at least one dielectric material is selected from a group consisting of silicon dioxide, silicon nitride, aluminum oxide, titanium nitride, glass, plastic, and combinations thereof.

17. The vertically-stacked electronic device of claim 13, wherein the first electrode terminal comprises at least one material selected from a group consisting of silicon, silicon carbide, gallium arsenide, platinum, palladium, aluminum, copper, tin, gold, silver, titanium, chromium, tungsten and combinations thereof.

18. The vertically-stacked electronic device of claim 13, wherein the carbon film is deposited by a technique selected from a group consisting of chemical vapor deposition and carbon atom sputtering.

19. The vertically-stacked electronic device of claim 13, wherein the vertically-stacked electronic device comprises a two-terminal memory device having an ON/OFF memory state.

20. The vertically-stacked electronic device of claim 13, wherein the vertically-stacked electronic device comprises a sensor.

21. The vertically-stacked electronic device of claim 13, wherein the vertically-stacked electronic device comprises a logic switch.

22. The vertically-stacked electronic device of claim 13, wherein the vertically-stacked electronic device is constructed atop a substrate.

23. An array comprising a plurality of vertically-stacked electronic devices, wherein each of the plurality of the vertically-stacked electronic devices comprises:
two electrode terminals; and
a carbon film comprising at least two graphitic layers;
wherein at least a portion of the carbon film lies between the two electrode terminals; and
wherein the carbon film is in electrical contact with the two electrode terminals; and
wherein each of the plurality of the vertically-stacked electronic devices exhibits a bistable current-voltage response when operated over a voltage sweep range, wherein the bistable current-voltage response comprises between a $10^4$-fold to $10^9$-fold change in current over a voltage sweep range of 0.5 V; and
wherein each of the plurality of the vertically-stacked electronic devices is electrically addressed independently.

24. The array of claim 23, wherein the at least two graphitic layers comprise a discontinuous carbon film.

25. The array of claim 24, wherein the discontinuous carbon film comprises a material selected from a group consisting of graphene, graphite, and combinations thereof.

26. The array of claim 23, wherein each of the plurality of the vertically-stacked electronic devices further comprises at least one dielectric material.

27. The array of claim 26, wherein the at least one dielectric material lies between at least a portion of the carbon film and at least a portion of at least one of the two electrode terminals.

28. The array of claim 26, wherein the at least one dielectric material is selected from a group consisting of silicon dioxide, silicon nitride, aluminum oxide, titanium nitride, glass, plastic, and combinations thereof.

29. The array of claim 23, wherein the two electrode terminals comprise at least one material selected from a group consisting of silicon, silicon carbide, gallium arsenide, platinum, palladium, aluminum, copper, tin, gold, silver, titanium, chromium, tungsten and combinations thereof; and
wherein selection of the at least one material is conducted independently for each of the two electrode terminals.

30. The array of claim 23, wherein the carbon film is deposited by a technique selected from a group consisting of chemical vapor deposition and carbon atom sputtering.

31. The array of claim 23, wherein the vertically-stacked electronic devices comprise two-terminal memory devices, each having an ON/OFF memory state; and
wherein the array comprises a multi-bit memory device.

32. The array of claim 23, wherein vertically-stacked electronic devices comprise sensors.

33. The array of claim 23, wherein the vertically-stacked electronic devices comprise logic switches.

34. The array of claim 23, wherein each of the plurality of the vertically-stacked electronic devices is constructed atop a substrate.

35. An array comprising a plurality of vertically-stacked electronic devices, wherein each of the plurality of the vertically-stacked electronic devices comprises:
a first electrode terminal;
a carbon film comprising at least two graphitic layers;
wherein the carbon film comprises a second electrode terminal; and
at least one dielectric material;
wherein the at least one dielectric material lies between at least a portion of the first electrode terminal and at least a portion of the carbon film; and
wherein each of the plurality of the vertically-stacked electronic devices exhibits a bistable current-voltage response when operated over a voltage sweep range, wherein the bistable current-voltage response comprises between a $10^4$-fold to $10^9$-fold change in current over a voltage sweep range of 0.5 V; and
wherein each of the plurality of the vertically-stacked electronic devices is electrically addressed independently.

36. The array of claim 35, wherein the at least two graphitic layers comprise a discontinuous carbon film.

37. The array of claim 36, wherein the discontinuous carbon film comprises a material selected from a group consisting of graphene, graphite, and combinations thereof.

38. The array of claim 35, wherein the at least one dielectric material is selected from a group consisting of silicon dioxide, silicon nitride, aluminum oxide, titanium nitride, glass, plastic, and combinations thereof.

39. The array of claim 35, wherein the first electrode terminal comprises at least one material selected from a group consisting of silicon, silicon carbide, gallium arsenide, platinum, palladium, aluminum, copper, tin, gold, silver, titanium, chromium, tungsten and combinations thereof.

40. The array of claim 35, wherein the carbon film is deposited by a technique selected from a group consisting of chemical vapor deposition and carbon atom sputtering.

41. The array of claim 35, wherein the vertically-stacked electronic devices comprise two-terminal memory devices, each having an ON/OFF memory state; and
wherein the array comprises a multi-bit memory device.

42. The array of claim 35, wherein vertically-stacked electronic devices comprise sensors.

43. The array of claim 35, wherein the vertically-stacked electronic devices comprise logic switches.

44. The array of claim 35, wherein each of the plurality of the vertically-stacked electronic devices is constructed atop a substrate.

45. A crossbar array of vertically-stacked electronic devices, wherein the crossbar array comprises:
at least one layer comprising a carbon film;
wherein the carbon film comprises at least two graphitic layers; and
at least two nanowire layers comprising a plurality of parallel nanowires;
wherein a first plurality of parallel nanowires in a first nanowire layer is orthogonal to a second plurality of parallel nanowires in alternating nanowire layers; and
wherein the plurality of parallel nanowires is in electrical contact with the at least one layer comprising a carbon film; and
wherein the at least one layer comprising a carbon film and the at least two nanowire layers comprise a plurality of vertically-stacked electronic devices; and
wherein each of the plurality of the vertically-stacked electronic devices exhibits a bistable current-voltage response when operated over a voltage sweep range, wherein the bistable current-voltage response comprises between a $10^4$-fold to $10^9$-fold change in current over a voltage sweep range of 0.5 V.

46. The crossbar array of claim 45, wherein the at least two graphitic layers comprise a discontinuous carbon film.

47. The crossbar array of claim 46, wherein the discontinuous carbon film comprises a material selected from a group consisting of graphene, graphite, and combinations thereof.

48. The crossbar array of claim 45, further comprising at least one layer comprising at least one dielectric material.

49. The crossbar array of claim 48, wherein the at least one layer comprising at least one dielectric material lies between at least a portion of the at least one layer comprising a carbon film and at least a portion of at least one of the at least two nanowire layers.

50. The crossbar array of claim 48, wherein the at least one dielectric material is selected from a group consisting of silicon dioxide, silicon nitride, aluminum oxide, titanium nitride, glass, plastic, and combinations thereof.

51. The crossbar array of claim 45, wherein the at least two nanowire layers comprise at least one material selected from a group consisting of silicon, silicon carbide, gallium arsenide, platinum, palladium, aluminum, copper, tin, gold, silver, titanium, chromium, tungsten and combinations thereof; and
wherein selection of the at least one material is conducted independently for each of the at least two nanowire layers.

52. The crossbar array of claim 45, wherein a single nanowire comprises a first electrode terminal for a plurality of vertically-stacked electronic devices perpendicular to a longitudinal axis of the single nanowire.

53. The crossbar array of claim 45, wherein at least a portion of the nanowire layers comprise a first electrode terminal for a first plurality of vertically-stacked electronic devices located below the nanowire layers and for a second plurality of vertically-stacked electronic devices located above the nanowire layers.

54. The crossbar array of claim 45, wherein the at least one layer comprising a carbon film is deposited by a technique selected from a group consisting of chemical vapor deposition and carbon atom sputtering.

55. The crossbar array of claim 45, wherein the vertically-stacked electronic devices comprise two-terminal memory devices, each having an ON/OFF memory state; and
wherein the crossbar array comprises a multi-bit memory device.

56. The crossbar array of claim 55, wherein the ON/OFF memory state is set and read by setting at least one voltage in the at least two nanowire layers.

57. The crossbar array of claim 45, wherein the vertically-stacked electronic devices comprise sensors.

58. The crossbar array of claim 45, wherein the vertically-stacked electronic devices comprise logic switches.

59. The vertically-stacked electronic device of claim 1, wherein the carbon film is unfunctionalized.

60. The vertically-stacked electronic device of claim 13, wherein the carbon film is unfunctionalized.

61. The array of claim 23, wherein the carbon film is unfunctionalized.

62. The array of claim 35, wherein the carbon film is unfunctionalized.

63. The crossbar array of claim 45, wherein the carbon film is unfunctionalized.

\* \* \* \* \*